US012750995B2

(12) United States Patent
Kwon et al.

(10) Patent No.: US 12,750,995 B2
(45) Date of Patent: Sep. 29, 2026

(54) SEMICONDUCTOR DEVICE AND METHOD FOR FABRICATING THE SAME

(71) Applicant: SK hynix Inc., Gyeonggi-do (KR)

(72) Inventors: Jung Min Kwon, Gyeonggi-do (KR); Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 663 days.

(21) Appl. No.: 18/295,267

(22) Filed: Apr. 4, 2023

(65) Prior Publication Data

US 2024/0130114 A1 Apr. 18, 2024

(30) Foreign Application Priority Data

Sep. 30, 2022 (KR) ........................ 10-2022-0124953

(51) Int. Cl.
*H10B 12/00* (2023.01)

(52) U.S. Cl.
CPC ............. *H10B 12/05* (2023.02); *H10B 12/02* (2023.02); *H10B 12/482* (2023.02)

(58) Field of Classification Search
CPC ...... H10B 12/02; H10B 12/03; H10B 12/033; H10B 12/05; H10B 12/30; H10B 12/48; H10B 12/482; H10B 12/488; H10D 1/714
See application file for complete search history.

(56) References Cited

U.S. PATENT DOCUMENTS 9,502,308 B1 * 11/2016 Park .................... H10D 84/038
2018/0323199 A1 11/2018 Roberts et al.
2021/0159229 A1 5/2021 Gomes et al.
2021/0183862 A1 6/2021 Son et al.

* cited by examiner

*Primary Examiner* — Britt Hanley
*Assistant Examiner* — Kevin Quinto
(74) *Attorney, Agent, or Firm* — IP&T GROUP LLP

(57) ABSTRACT

A method for fabricating a semiconductor device includes forming a stack body over a substrate; forming a sacrificial vertical structure including a double spacer in a first region of the stack body; forming a separation slit including a single spacer in a second region of the stack body to be spaced apart from the sacrificial vertical structure; forming a vertical opening in the first region of the stack body by removing the sacrificial vertical structure; and forming a vertical conductive line filling the vertical opening.

12 Claims, 22 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0124953, filed on Sep. 30, 2022, which is incorporated herein by reference in its entirety.

BACKGROUND

1. Field

Embodiments of the present invention relate to a semiconductor device, and more particularly, to a semiconductor device of a three-dimensional (3D) structure, and a method for fabricating the semiconductor device.

2. Description of the Related Art

Recently, in order to cope with the demands for large capacity and miniaturization of memory devices, technology for providing a three-dimensional (3D) memory device in which a plurality of memory cells are stacked has been advanced.

SUMMARY

Embodiments of the present invention are directed to a semiconductor device including highly integrated memory cells, and a method for fabricating the semiconductor device.

In accordance with one embodiment of the present invention, a method for fabricating a semiconductor device may include forming a stack body over a substrate; forming a sacrificial vertical structure including a double spacer in a first region of the stack body; forming a separation slit including a single spacer in a second region of the stack body to be spaced apart from the sacrificial vertical structure; forming a vertical opening in the first region of the stack body by removing the sacrificial vertical structure; and forming a vertical conductive line filling the vertical opening.

In accordance with another embodiment of the present invention, a method for fabricating a semiconductor device may include forming a stack body over a substrate; forming a first opening in a first region of the stack body; forming a second opening in a second region of the stack body; forming a first spacer over the first opening and the second opening; removing the first spacer from the second opening in the second region to leave the first spacer in the first region; forming a second spacer over the first spacer and the second opening; and forming a gap-fill layer filling the first opening and the second opening over the second spacer.

In accordance with another embodiment of the present invention, a semiconductor device may include a first stack and a second stack formed to be spaced apart from each other over a lower structure, each of the first stack and the second stack including a vertical stack portion and a pad stack portion extending from the vertical stack portion; a separation slit formed between the pad stack portion of the first stack and the pad stack portion of the second stack; and a plurality of vertical isolation layers formed between the vertical stack portion of the first stack and the vertical stack portion of the second stack, wherein the separation slit has a single spacer structure, and each of the vertical isolation layers has a double spacer structure. The single spacer structure of the separation slit includes a first spacer, and the double spacer structure of the vertical isolation layers includes the first spacer and a second spacer over the first spacer. The first spacer includes silicon oxide, and the second spacer includes silicon nitride. The semiconductor device further includes an additional vertical isolation layer formed between the separation slit and the vertical isolation layers. The additional vertical isolation layer partially overlaps with an edge of the separation slit, and the additional vertical isolation layer and the vertical isolation layers are horizontally spaced apart from each other. The single spacer structure of the separation slit includes a first spacer, and the double spacer structure of the vertical isolation layers and the additional vertical isolation layer includes the first spacer and a second spacer over the first spacer. Each of the first stack and the second stack includes a plurality of horizontal conductive lines. The semiconductor device further includes a plurality of horizontal layers spaced apart horizontally in a direction crossing each of the horizontal conductive lines; a vertical conductive line commonly coupled to first ends of the horizontal layers and extending in a direction perpendicular to a surface of the lower structure; and data storage elements respectively coupled to second ends of the horizontal layers, and stacked in the direction perpendicular to the surface of the lower structure.

In accordance with another embodiment of the present invention, a semiconductor device may include at least two vertical stacks in a cell array region; at least two pad stacks in a contact region horizontally displaced from the at least two vertical stacks in the cell array region, a separation slit formed between the at least two pad stacks in the contact region; a plurality of vertical isolation layers formed between the at least two vertical stack portions; and a plurality of conductive lines included in each of the vertical stacks and the pad stacks, wherein the separation slit has a single spacer structure, and each of the vertical isolation layers has a double spacer structure. The semiconductor device further includes an additional vertical isolation layer formed between the separation slit and at least one of the plurality of vertical isolation layers. The additional vertical isolation layer partially overlaps with an edge of the separation slit.

DETAILED DESCRIPTION

Figure 1:
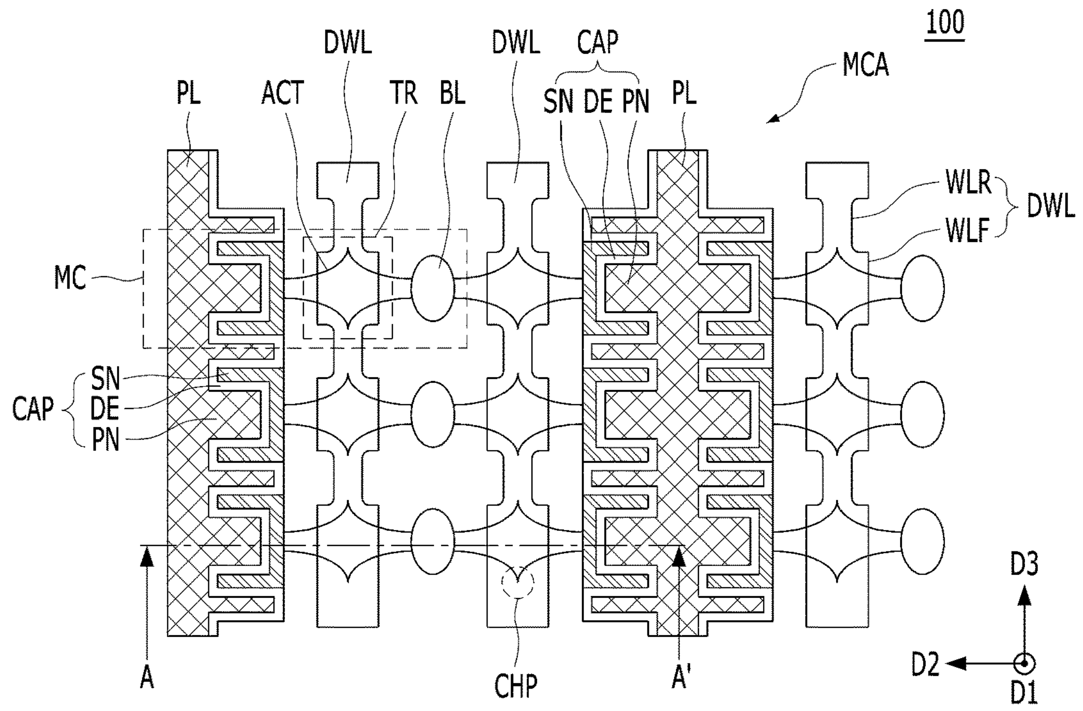
FIG. 1 is a schematic plan view illustrating a semiconductor device in accordance with one embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiment of the present invention described below may increase memory cell density and reduce parasitic capacitance by vertically stacking memory cells.

Figure 2:
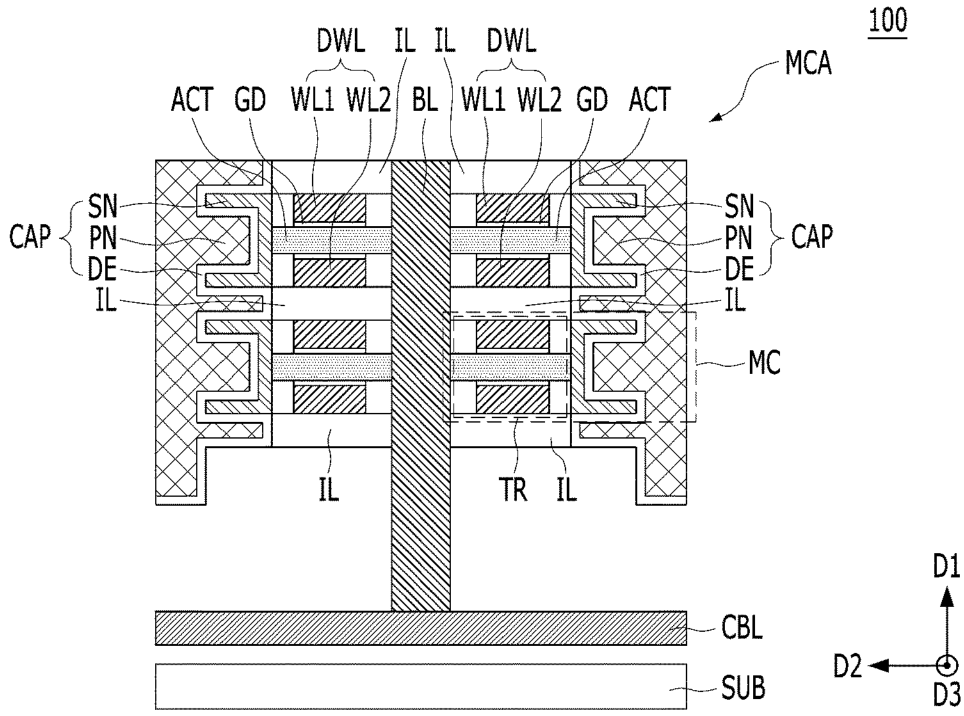
FIG. 2 is a schematic cross-sectional view of the semiconductor device taken along a line A-A' shown in FIG. 1.

FIG. 1 is a schematic plan view illustrating a semiconductor device 100 in accordance with one embodiment of the present invention. FIG. 2 is a schematic cross-sectional view of the semiconductor device 100 taken along a line A-A' shown in FIG. 1.

Referring to FIGS. 1 and 2, the semiconductor device 100 may include a lower structure SUB, a conductive pad CBL, and a memory cell array MCA. The memory cell array MCA may include a plurality of memory cells MC. The memory cell array MCA may include a three-dimensional array of memory cells MC. The three-dimensional array of the memory cells MC may include a column array and a row array. The column array of memory cells MC may include memory cells MC that are stacked in a first direction D1, and the row array of memory cells MC may include memory cells MC that are horizontally arranged in a second direction D2 and in a third direction D3. Cell isolation layers IL may be disposed between the memory cells MC that are stacked in the first direction D1. The cell isolation layers IL may include a dielectric material.

Each of the memory cell MC may include a vertical conductive line BL, a transistor TR, and a data storage element CAP. The transistor TR may include a horizontal layer ACT and a horizontal conductive line DWL.

According to one embodiment of the present invention, each of the memory cell MC may include a memory cell of a Dynamic Random Access Memory (DRAM). The vertical conductive line BL may include a bit line, and the transistor TR may include a cell transistor. The data storage element CAP may include a memory element, such as a capacitor. The horizontal layer ACT of the transistor TR may include an active layer, and the horizontal conductive line DWL of the transistor TR may include a word line or a gate line. According to another embodiment of the present invention, the transistor TR may be referred to as an access element, a selection element, or a switching element.

According to another embodiment of the present invention, the horizontal layer ACT of the transistor TR may include a first source/drain region, a second source/drain region, and a channel between the first source/drain region and the second source/drain region. The horizontal conductive line DWL may vertically overlap with the channel of the horizontal layer ACT.

In the first direction D1, cell isolation layers IL may be disposed between the stacked transistors TR. The transistors TR may include a horizontal layer ACT and a horizontal conductive line DWL, and the horizontal conductive line DWL may have a double line structure. For example, the horizontal conductive line DWL may include a first horizontal conductive line WL1 and a second horizontal conductive line WL2 that are facing each other in the first direction D1 with the horizontal layer ACT interposed therebetween. Each of the first and second horizontal conductive lines WL1 and WL2 may have a line structure and, for example, the first and second horizontal conductive lines WL1 and WL2 may extend in the third direction D3. The data storage element CAP may include a first electrode SN, a dielectric layer DE, and a second electrode PN.

Since the memory cell array MCA includes the memory cells MC that are stacked in the first direction D1, the memory cell array MCA may include a vertical conductive line BL, the horizontal layers ACT, and the horizontal conductive lines DWL, and the data storage elements CAP. The memory cell array MCA may include transistors TR that are stacked in the first direction D1. The memory cell array MCA may include the data storage elements CAP that are stacked in the first direction D1. The memory cell array MCA may include the horizontal conductive lines DWL that are stacked in the first direction D1. The memory cell array MCA may include a plurality of vertical conductive lines BL extending vertically in the first direction D1 and disposed in the third direction D3.

First sides (or a first source/drain region) of the transistors TR may be coupled to the vertical conductive line BL, and second sides (or a second source/drain region) of the transistors TR may be coupled to the data storage element CAP. In other words, the first sides of the horizontal layers ACT may be commonly coupled to the vertical conductive line BL, and the second sides of the horizontal layers ACT may each be coupled to the first electrodes SN of the data storage element CAP. Referring back to FIG. 2, the memory cell array MCA may be a mirror-type memory cell array that shares the vertical conductive line BL. The memory cells MC disposed in the second direction D2 may share the vertical conductive line BL.

The vertical conductive line BL may extend in the first direction D1 which is perpendicular to the surface of the lower structure SUB. The horizontal layers ACT may extend in the second direction D2 which is parallel to the surface of the lower structure SUB. The horizontal conductive lines DWL may extend in the third direction D3 which is parallel to the surface of the lower structure SUB. Here, the first direction D1, the second direction D2, and the third direction D3 may cross each other.

The lower structure SUB may include a semiconductor substrate. The lower structure SUB may include for example a silicon substrate, a compound semiconductor substrate, an SOI substrate, a dielectric material, or a combination thereof.

A conductive pad CBL may be disposed between the lower structure SUB and the vertical conductive line BL. The vertical conductive line BL may be vertically oriented in the first direction D1. The vertical conductive line BL may be electrically connected to the conductive pad CBL. The conductive pad CBL may be disposed at a lower level than the memory cell array MCA. The vertical conductive line BL may be referred to as a vertically oriented bit line or a pillar-shaped bit line. The vertical conductive line BL may include a conductive material. The vertical conductive line BL may include for example a silicon-based material, a metal-based material, or a combination thereof. The vertical conductive line BL may include for example silicon, a metal, a metal nitride, a metal silicide, or a combination thereof. The vertical conductive line BL may include for example polysilicon, titanium nitride, tungsten, or a combination thereof. In a particular example, the vertical conductive line BL may include titanium nitride (TiN) or polysilicon doped with an N-type impurity. The vertical conductive line BL may include a 'TiN/W stack' including titanium nitride and tungsten over titanium nitride. The conductive pad CBL may include a metal-based material. The conductive pad CBL may include titanium nitride, tungsten, or a combination thereof.

The horizontal layers ACT may be horizontally arranged in the second direction D2 from the vertical conductive line BL. The horizontal conductive lines DWL may include a pair of horizontal conductive lines, that is, a first horizontal conductive line WL1 and a second horizontal conductive line WL2. The first horizontal conductive line WL1 and the second horizontal conductive line WL2 may face each other with the horizontal layer ACT interposed therebetween. A thin dielectric layer GD may be formed on the upper and lower surfaces of the horizontal layers ACT. The thin dielectric layer GD may include a gate dielectric layer. Each of the horizontal layers ACT may include a protruding channel CHP (as shown in FIG. 1). The protruding channel CHP may vertically overlap with the horizontal conductive line DWL.

The horizontal layers ACT may include a semiconductor material or an oxide semiconductor material. For example, the horizontal layers ACT may include monocrystalline silicon, germanium, silicon-germanium, or indium gallium zinc oxide (IGZO).

The transistor TR may be a cell transistor, and one transistor TR may have one horizontal conductive line DWL. In the horizontal conductive line DWL, the same voltage may be applied to the first horizontal conductive line WL1 and the second horizontal conductive line WL2. For example, the first horizontal conductive line WL1 and the second horizontal conductive line WL2 may form a pair, and the same driving voltage may be applied to the first horizontal conductive line WL1 and the second horizontal conductive line WL2. As described above, the memory cell MC according to one embodiment of the present invention may have the horizontal conductive line DWL of a double structure in which the first and second horizontal conductive lines WL1 and WL2 are adjacent to one horizontal layer ACT. The transistor TR may include a double gate transistor.

According to another embodiment of the present invention, different voltages may be applied to the first horizontal conductive line WL1 and the second horizontal conductive line WL2, respectively. For example, a driving voltage may be applied to the first horizontal conductive line WL1, and a ground voltage may be applied to the second horizontal conductive line WL2. The second horizontal conductive line WL2 may be referred to as a back line or a shield line. According to another embodiment of the present invention, the ground voltage may be applied to the first horizontal conductive line WL1, and the driving voltage may be applied to the second horizontal conductive line WL2.

The horizontal conductive line DWL may include two notch-type sidewalls. Each of the notch-type sidewalls may include a plurality of flat surfaces WLF and a plurality of recessed surfaces WLR (as shown in FIG. 1). The flat surfaces WLF and the recessed surfaces WLR may be alternately disposed in the third direction D3. The flat surfaces WLF may be adjacent to the vertical conductive lines BL and the data storage elements CAP in the second direction D3.

The thin gate dielectric layer GD may include for example silicon oxide, silicon nitride, a metal oxide, a metal oxynitride, a metal silicate, a high-k material, a ferroelectric material, an anti-ferroelectric material or a combination thereof. The thin gate dielectric layer GD may include for example $SiO_2$, $Si_3N_4$, $HfO_2$, $Al_2O_3$, $ZrO_2$, AlON, HfON, HfSiO, HfSiON, HfZrO or a combination thereof.

The horizontal conductive line DWL may include for example a metal, a metal alloy, or a semiconductor material. The horizontal conductive line DWL may include for example titanium nitride, tungsten, polysilicon, or a combination thereof. In a particular example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of approximately 4.5 eV or less, and the P-type work function material may have a high work function of approximately 4.5 eV or higher.

The data storage elements CAP may be disposed horizontally from the transistor TR in the second direction D2. The data storage element CAP may include a first electrode SN that extends horizontally from the horizontal layer ACT. The data storage element CAP may further include a dielectric layer DE over the first electrode SN and a second electrode PN over the dielectric layer DE. The first electrode SN, the dielectric layer DE, and the second electrode PN may be arranged horizontally. The first electrode SN may have a horizontally oriented cylinder shape. The dielectric layer DE may conformally cover the cylindrical inner wall and the cylindrical outer wall of the first electrode SN. The second electrode PN may have a shape extending to the cylindrical inner wall and the cylindrical outer wall of the first electrode SN over the dielectric layer DE.

The first electrode SN may have a three-dimensional structure, and the first electrode SN of the three-dimensional structure may have a horizontal three-dimensional structure which is oriented in the second direction D2. As an example of the three-dimensional structure, the first electrode SN may have a cylindrical shape. According to another embodiment of the present invention, the first electrode SN may have a pillar shape or a pylinder shape. The pylinder shape may refer to a structure in which a pillar shape and a cylindrical shape are merged.

The second electrodes PN of the data storage elements CAP may be coupled to each other, and the second electrodes PN may be coupled to a common plate PL. The second electrodes PN and the common plate PL may not be coupled to the conductive pad CBL.

The first electrode SN and the second electrode PN may include for example a metal, a noble metal, a metal nitride, a conductive metal oxide, a conductive noble metal oxide, a metal carbide, a metal silicide, or a combination thereof. In particular examples, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The second electrode PN may include a combination of a metal-based material and a silicon-based material. In a particular example, the second electrode PN may be a stack of titanium nitride/silicon germanium/tungsten nitride (TiN/SiGe/WN).

In the titanium nitride/silicon germanium/tungsten nitride (TiN/SiGe/WN) stack, silicon germanium may be a gap-fill material filling the cylindrical inside of the first electrode SN over the titanium nitride, and titanium nitride (TiN) may serve as a second electrode PN of a capacitor CAP, and tungsten nitride may be a low-resistance material.

The dielectric layer DE may be referred to as a capacitor dielectric layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include for example hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). For example, the dielectric layer DE may include a ZA ($ZrO_2$/$Al_2O_3$) stack or a ZAZ ($ZrO_2$/$Al_2O_3$/$ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). For example, the dielectric layer DE may include an HA ($HfO_2$/$Al_2O_3$) stack or an HAH ($HfO_2$/$Al_2O_3$/$HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include for example a ZAZA ($ZrO_2$/$Al_2O_3$/$ZrO_2$/$Al_2O_3$) stack, a ZAZAZ ($ZrO_2$/$Al_2O_3$/$ZrO_2$/$Al_2O_3$/$ZrO_2$) stack, a HAHA ($HfO_2$/$Al_2O_3$/$HfO_2$/$Al_2O_3$) stack, or a HAHAH ($HfO_2$/$Al_2O_3$/$HfO_2$/$Al_2O_3$/$HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including for example zirconium oxide, hafnium oxide, and aluminum oxide.

According to another embodiment of the present invention, the dielectric layer DE may include a ferroelectric material or an antiferroelectric material.

According to another embodiment of the present invention, an interface control layer for improving leakage current may be further formed between the first electrode SN and the dielectric layer DE. The interface control layer may include titanium oxide ($TiO_2$), niobium oxide, or niobium nitride. The interface control layer may also be formed between the second electrode PN and the dielectric layer DE.

The data storage element CAP may include a metal-insulator-metal (MIM) capacitor.

The data storage element CAP may be replaced with another data storage material other than a capacitor. For example, the data storage material may be a phase change material, a magnetic tunnel junction (MTJ), or a variable resistance material.

The memory cell array MCA may include a plurality of memory cells MC, where each memory cell MC may include a vertically oriented vertical conductive line BL, a horizontally oriented horizontal layer ACT, a horizontally oriented horizontal conductive line DWL, and a data storage element CAP.

The horizontal layers ACT disposed adjacent to each other in the first direction D1 may contact one vertical conductive line BL. The horizontal layers ACT disposed adjacent to each other in the third direction D3 may share one horizontal conductive line DWL. The data storage elements CAP may be coupled to the horizontal layers ACT, respectively.

In the memory cell array MCA, a plurality of horizontal conductive lines DWL may be vertically stacked in the first direction D1. Each of the horizontal conductive lines DWL may include a pair of the first horizontal conductive line WL1 and the second horizontal conductive line WL2. Between the first horizontal conductive line WL1 and the second horizontal conductive line WL2, a plurality of horizontal layers ACT may be arranged horizontally to be spaced apart from each other in the third direction D3.

The semiconductor device 100 may further include a peripheral circuit portion. The peripheral circuit portion may be included in the lower structure SUB, or disposed over the lower structure SUB. The peripheral circuit portion may be disposed at a lower level than the memory cell array MCA. This may be referred to as a COP (Cell-Over-Peripheral) structure. The peripheral circuit portion may include at least one control circuit for driving the memory cell array MCA. The at least one control circuit of the peripheral circuit portion may include an N-channel transistor, a P-channel transistor, a CMOS circuit, or a combination thereof. The at least one control circuit of the peripheral circuit portion may include an address decoder circuit, a read circuit, a write circuit, and the like. The at least one control circuit of the peripheral circuit portion may include for example a planar channel transistor, a recess channel transistor, a buried gate transistor, a fin channel transistor (FinFET), etc.

The peripheral circuit portion may include sub-word line drivers and a sense amplifier. For example, the horizontal conductive lines DWL may be coupled to the sub-word line drivers, and the vertical conductive lines BL may be coupled to the sense amplifier. An interconnection structure such as a multi-level metal may be disposed between the peripheral circuit portion and the memory cell array MCA.

According to another embodiment of the present invention, the peripheral circuit portion may be disposed at a higher level than the memory cell array MCA. This may be referred to as a POC (Peripheral-Over-Cell) structure.

According to another embodiment of the present invention, the memory cell array MCA may be formed over a first substrate, and the peripheral circuit portion may be formed over a second substrate, and then the memory cell array MCA and the peripheral circuit portion may be bonded together by a wafer bonding method.

FIGS. 3 to 19 illustrate an example of a method for fabricating a semiconductor device in accordance with one embodiment of the present invention. FIGS. 3 to 19 illustrate an example of a fabrication method taken along a line A-A' shown in FIG. 1.

Figure 3:
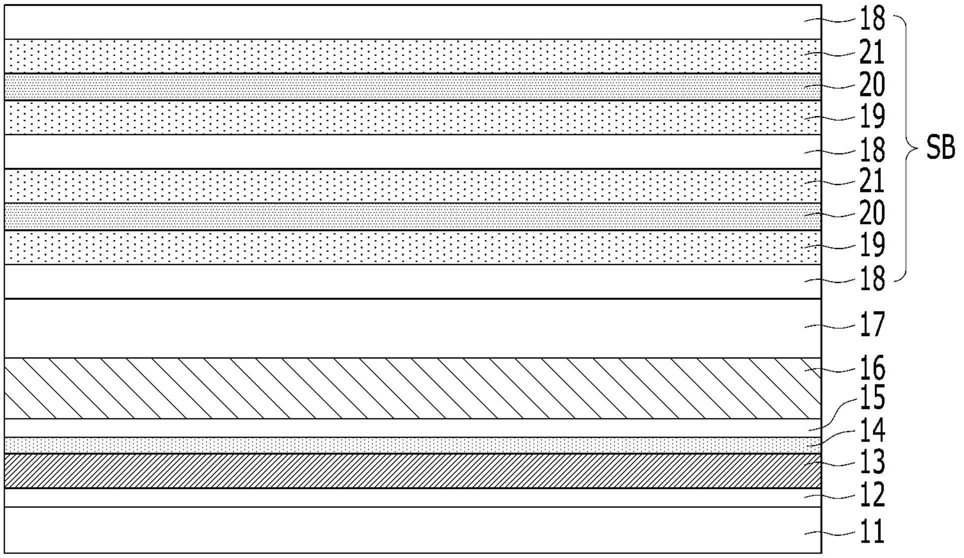
FIGS. 3 to 19 illustrate an example of a method for fabricating a semiconductor device in accordance with another embodiment of the present invention.

Referring to FIG. 3, a buffer layer 12 may be formed over a substrate 11. The buffer layer 12 may include a dielectric material. The buffer layer 12 may include silicon oxide. The substrate 11 may include a semiconductor substrate, for example, a silicon substrate.

A conductive pad 13 may be formed over the buffer layer 12. The conductive pad 13 may include a conductive material. For example, the conductive pad 13 may include a metal-based material. The conductive pad 13 may include tungsten, titanium nitride, or a combination thereof.

An etch stopper layer 14 may be formed over the conductive pad 13. The etch stopper layer 14 may include a dielectric material. The etch stopper layer 14 may include silicon nitride.

A first inter-layer dielectric layer 15 may be formed over the etch stopper layer 14. The first inter-layer dielectric layer 15 may include silicon oxide.

A sacrificial pad 16 may be formed over the first inter-layer dielectric layer 15. The sacrificial pad 16 may include a metal-based material. The sacrificial pad 16 may include tungsten, titanium nitride, or a combination thereof.

The sacrificial pad 16 may serve as an etch stopper during a subsequent etching process. The sacrificial pad 16 and the conductive pad 13 may include the same material. Each of the sacrificial pad 16 and the conductive pad 13 may be a metallic pad. The sacrificial pad 16 may be thicker than the conductive pad 13.

A second inter-layer dielectric layer 17 may be formed over the sacrificial pad 16. The second inter-layer dielectric layer 17 may include silicon oxide. The second inter-layer dielectric layer 17 may be thicker than the first inter-layer dielectric layer 15.

A stack body SB may be formed over the second inter-layer dielectric layer 17. The stack body SB may include a sub-stack in which a cell isolation layer 18, a first sacrificial layer 19, a semiconductor layer 20, and a second sacrificial layer 21 are stacked in the mentioned order. The stack body SB may be formed by repeating the sub-stacks several times. The cell isolation layer 18 may be formed on the top of the stack bodies SB. The uppermost cell isolation layer 18 may be thicker than other cell isolation layers 18. The stack body SB may include a plurality of the cell isolation layers 18, a plurality of the first sacrificial layers 19, a plurality of the semiconductor layers 20, and a plurality of the second sacrificial layers 21. The stack body SB may have a structure in which a triple layer of the first sacrificial layer 19, the semiconductor layer 20, and the second sacrificial layer 21 is disposed between the cell isolation layers 18.

The cell isolation layers 18 may include silicon oxide. The first and second sacrificial layers 19 and 21 may include silicon nitride. The semiconductor layers 20 may include a semiconductor material or an oxide semiconductor material. The semiconductor layers 20 may include for example monocrystalline silicon, polysilicon, silicon germanium, indium gallium zinc oxide (IGZO), or a combination thereof.

Figure 4:
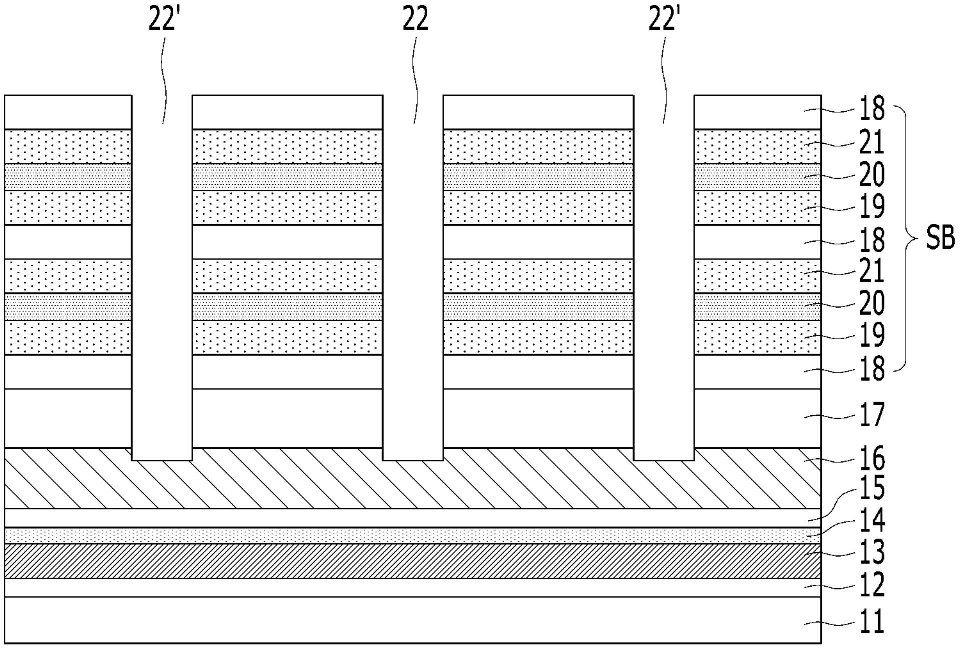

Referring to FIG. 4, a first sacrificial opening 22 and a second sacrificial opening 22' passing through a first portion of the stack body SB may be formed. The first sacrificial opening 22 and the second sacrificial opening 22' may extend vertically through the second inter-layer dielectric layer 17 to expose the sacrificial pad 16. In other words, the first and second sacrificial openings 22 and 22' may vertically penetrate the stack body SB and the second inter-layer dielectric layer 17. The stack body SB and the second inter-layer dielectric layer 17 may be sequentially etched to form the first and second sacrificial openings 22 and 22'. An etching process for forming the first and second sacrificial openings 22 and 22' may stop at the sacrificial pad 16.

Figure 5:
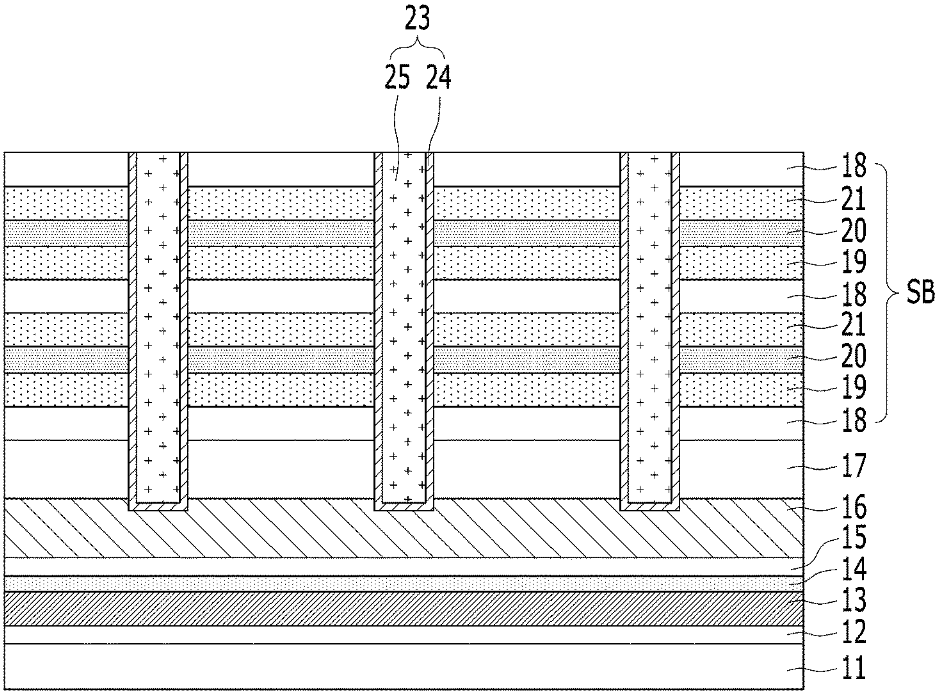

Referring to FIG. 5, sacrificial vertical structures 23 filling the first and second sacrificial openings 22 and 22' may be formed. Forming the sacrificial vertical structures 23 may include depositing and planarizing a dielectric material to fill the first and second sacrificial openings 22 and 22'. The sacrificial vertical structures 23 may include for example silicon oxide, silicon nitride, silicon carbon oxide, or a combination thereof. In a particular example, each of the sacrificial vertical structures 23 may include a silicon nitride liner 24 and a silicon oxide layer 25. According to another embodiment of the present invention, each of the sacrificial vertical structures 23 may include a stack of a silicon oxide liner, a silicon nitride liner, and a silicon oxide layer.

Figure 6:
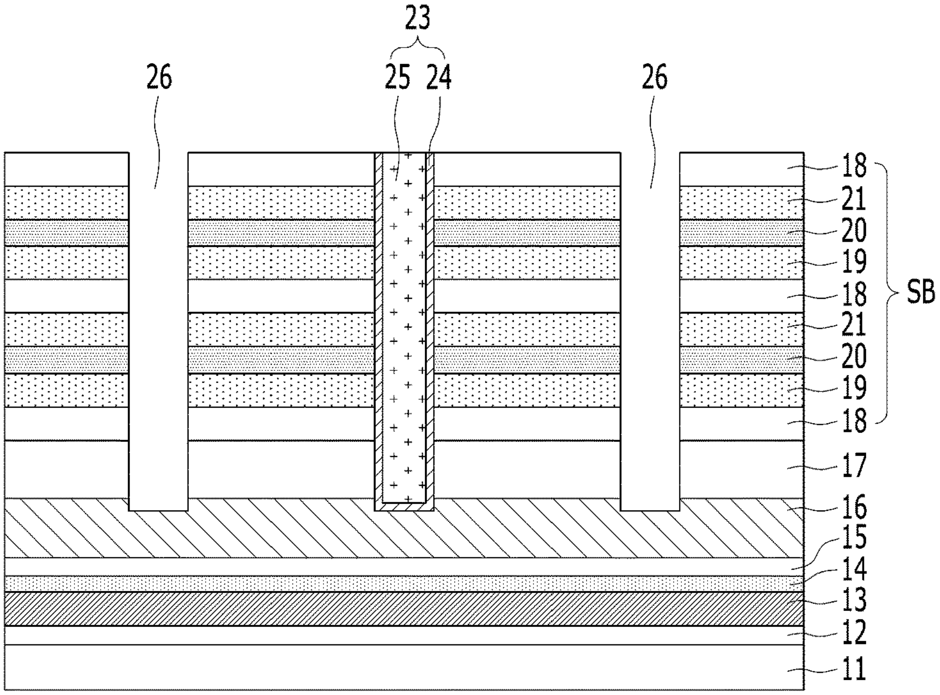

Referring to FIG. 6, some of the sacrificial vertical structures 23 may be removed to form third sacrificial openings 26. For example, the sacrificial vertical structures 23 filling the second sacrificial openings 22' may be removed. As a result, the second sacrificial openings 22' may be exposed again, and the exposed second sacrificial openings 22' may be simply referred to as third sacrificial openings 26.

Figure 7:
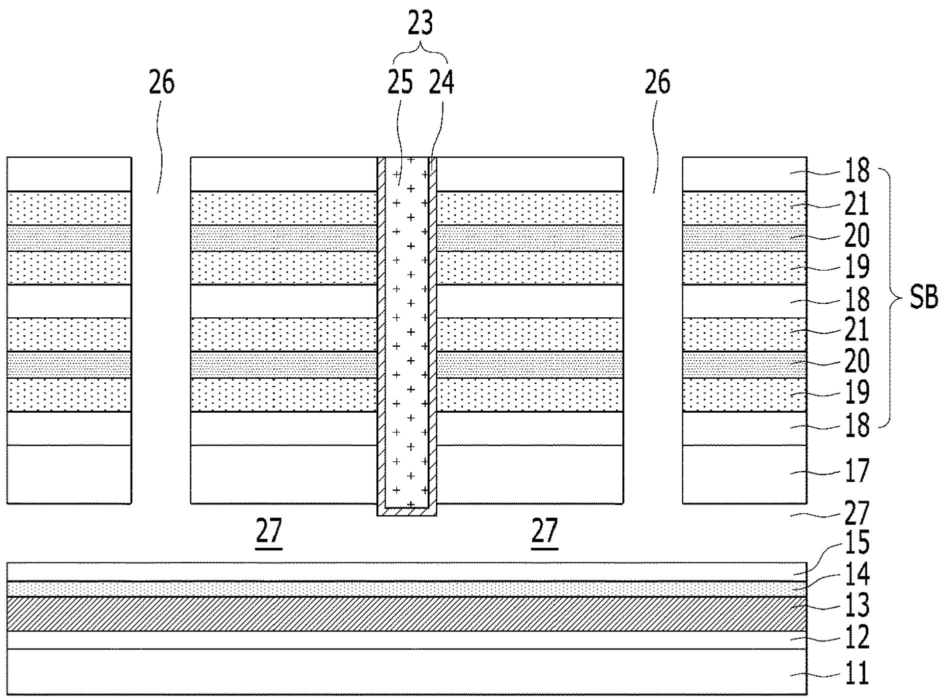

Referring to FIG. 7, the sacrificial pad 16 below the third sacrificial openings 26 may be removed. The sacrificial pad 16 may be removed using dry etching or wet etching. The space from which the sacrificial pad 16 is removed may become a horizontal-level recess 27. The horizontal-level recess 27 may be disposed between the second inter-layer dielectric layer 17 and the first inter-layer dielectric layer 15. The bottom surface of the sacrificial vertical structure 23 may be exposed by the horizontal-level recess 27.

Figure 8:
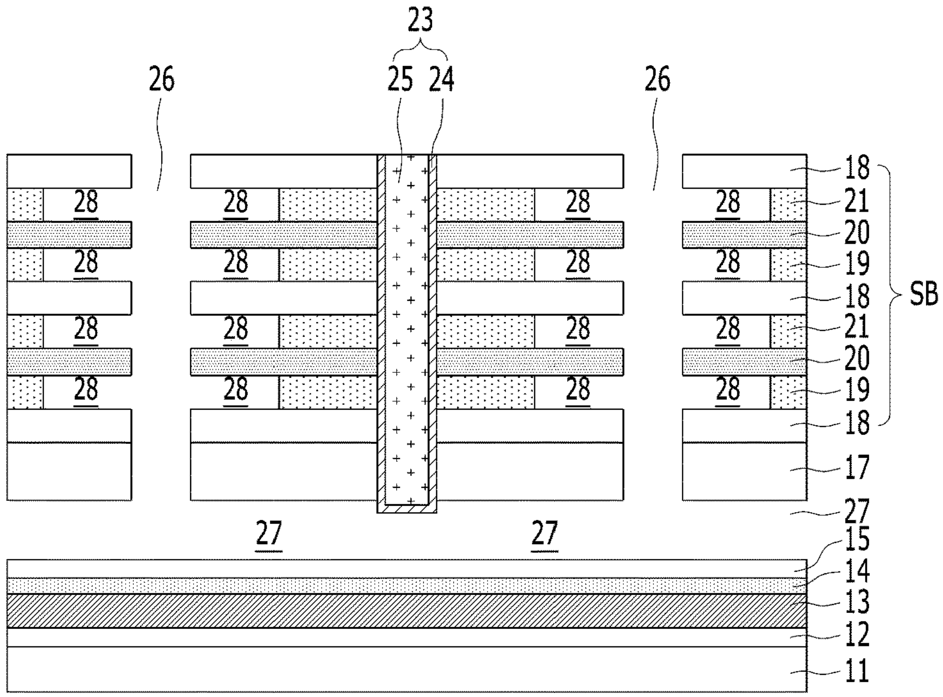

Referring to FIG. 8, the first and second sacrificial layers 19 and 21 may be partially removed through the third sacrificial openings 26. As a result, sacrificial layer level recesses 28 may be formed with the semiconductor layers 20 interposed therebetween. The sacrificial layer level recesses 28 may expose portions of the semiconductor layers 20.

Figure 9:
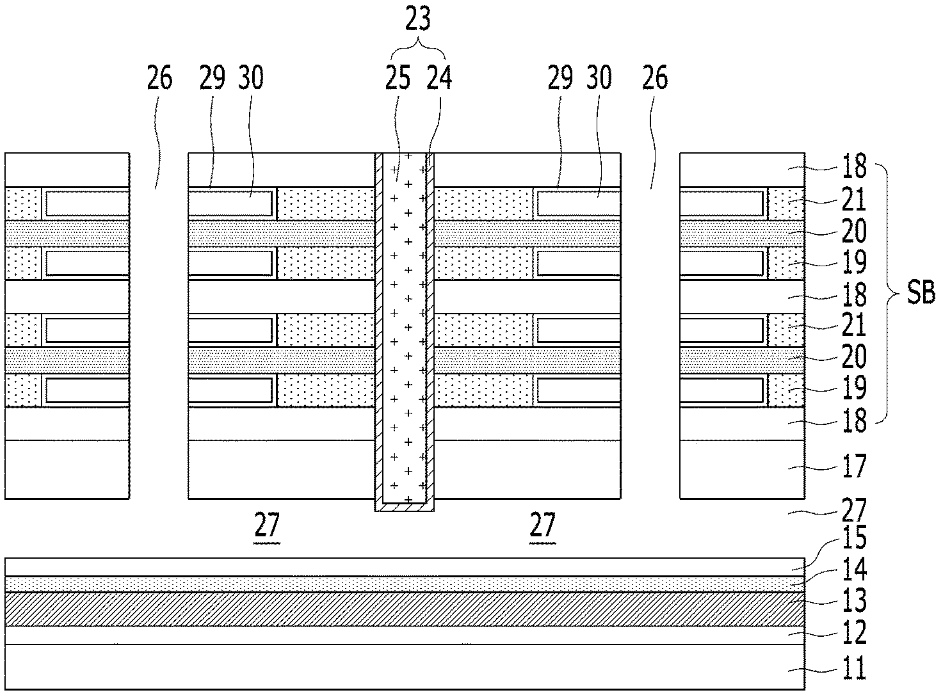

Referring to FIG. 9, a first liner layer 29 and a second liner layer 30 filling the sacrificial layer level recesses 28 may be sequentially formed. The first liner layer 29 may conformally cover the surfaces of the sacrificial layer level recesses 28. The second liner layer 30 may fill the sacrificial layer level recesses 28 over the first liner layer 29. The first liner layer 29 and the second liner layer 30 may not fill the third sacrificial openings 26 and the horizontal-level recess 27. Each of the first liner layer 29 and the second liner layer 30 may include silicon oxide, silicon nitride, or a combination thereof.

Figure 10:
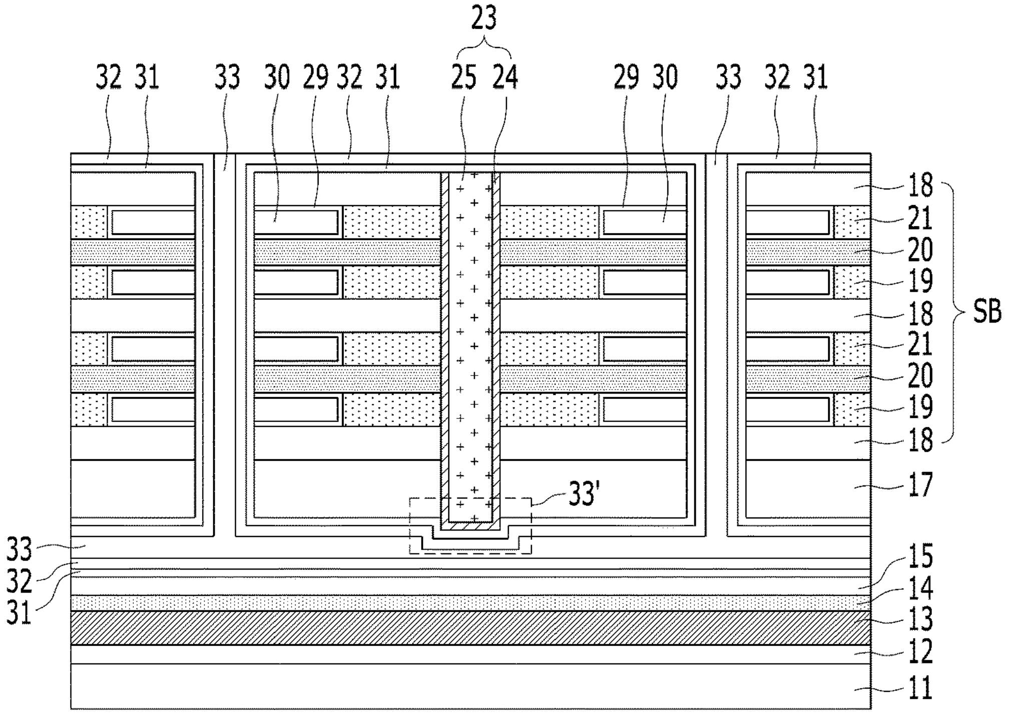

Referring to FIG. 10, the etch stop liner layer 31, the sacrificial liner layer 32, and the sacrificial gap-fill layer 33 may be sequentially formed. The etch stop liner layer 31 and the sacrificial gap-fill layer 33 may include silicon oxide. The sacrificial liner layer 32 may include silicon nitride. The sacrificial gap-fill layer 33 may fill the third sacrificial openings 26 over the sacrificial liner layer 32. The etch stop liner layer 31, the sacrificial liner layer 32, and the sacrificial gap-fill layer 33 may fill the horizontal-level recess 27.

Referring to the reference numeral 33', the bottom portion of the sacrificial vertical structure 23 may directly contact the etch stop liner layer 31. The etch stop liner layer 31 may have a shape surrounding the bottom portion of the sacrificial vertical structure 23. In other words, the etch stop liner layer 31 may protect the silicon nitride liner 24 of the sacrificial vertical structure 23.

The sacrificial gap-fill layer 33 may be planarized to expose the uppermost surface of the sacrificial liner layer 32.

Figure 11:
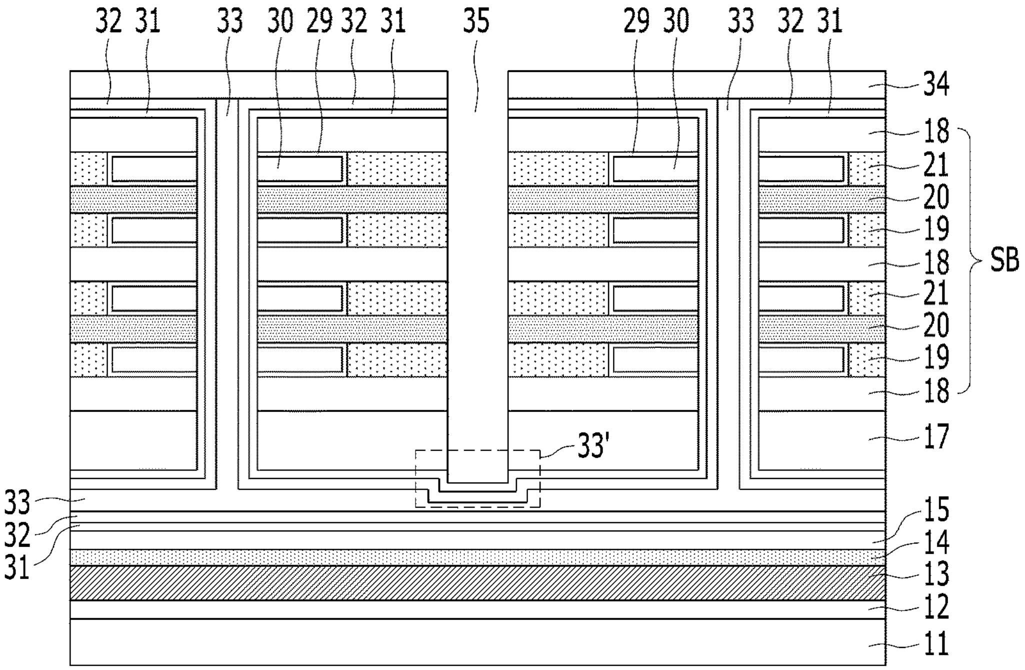

Referring to FIG. 11, a hard mask pattern 34 covering the uppermost surface of the sacrificial liner layer 32 and the exposed surface of the sacrificial gap-fill layer 33 may be formed.

Subsequently, the sacrificial vertical structure 23 may be etched by using the hard mask pattern 34. For example, the silicon oxide layer 25 and the silicon nitride liner 24 may be sequentially removed. The sacrificial vertical structure 23 may be removed to form a first vertical opening 35.

To form the first vertical opening 35, the sacrificial vertical structure 23 may be removed using dry etching or wet etching. During the etching process for removing the sacrificial vertical structure 23, the etching process may stop at the etch stop liner layer 31 as illustrated by the reference numeral 33'.

The etch stop liner layer 31 may protect the surrounding structures from being damaged while the sacrificial vertical structure 23 is removed. For example, the etch stop liner layer 31 may be able to protect the sacrificial liner layer 32 and the sacrificial gap-fill layer 33 from being attacked.

Subsequently, through a series of the processes illustrated in FIGS. 12 and 13, the first sacrificial layers 19 and the second sacrificial layers 21 may be replaced with horizontal conductive lines 38 and 39.

Figure 12:
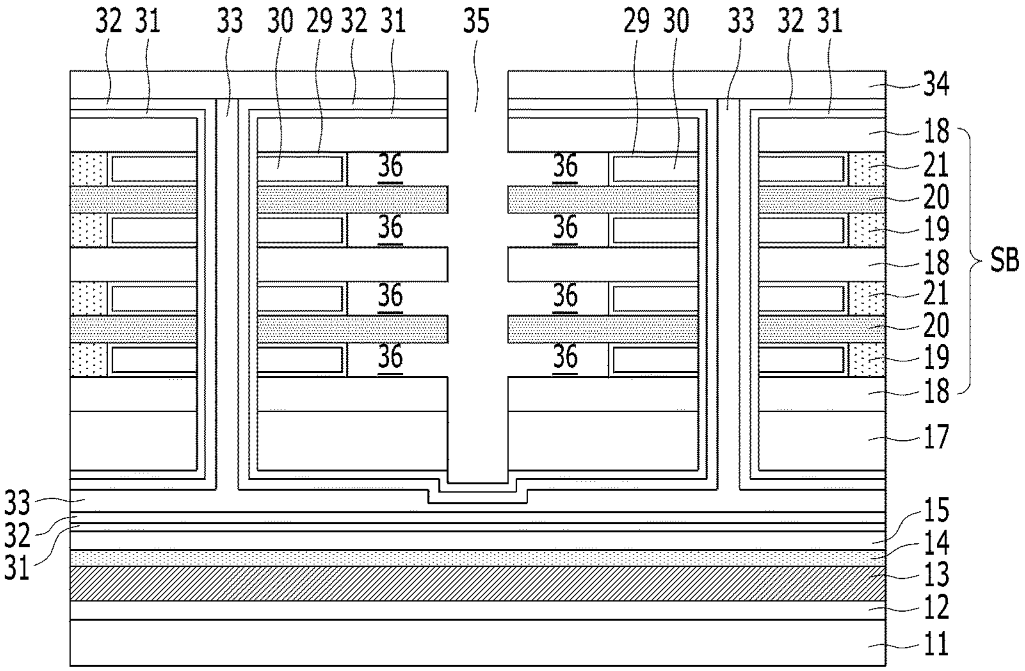

Referring to FIG. 12, the first and second sacrificial layers 19 and 21 may be removed to form line-level recesses 36 through the first vertical opening 35. As the first and second sacrificial layers 19 and 21 are removed, a pair of line-level recesses 36 may be formed with the semiconductor layer 20 interposed therebetween. Portions of the semiconductor layer 20 may be exposed by the line-level recesses 36.

Figure 13:
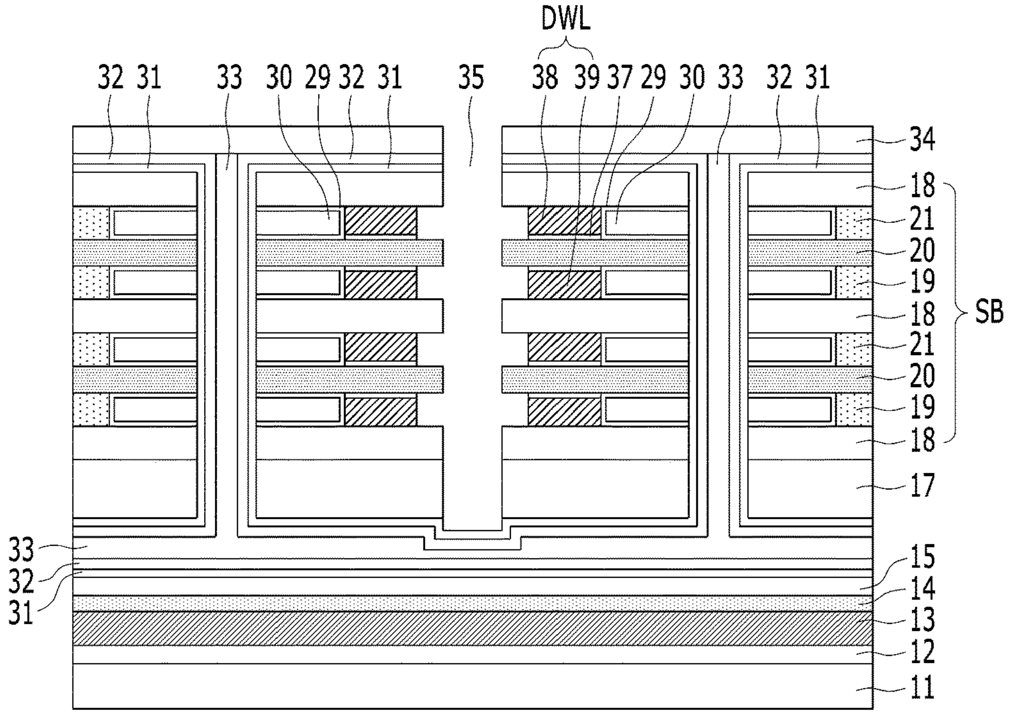

Referring to FIG. 13, a relatively thin dielectric layer 37 (as compared to the thickness of the horizontal conductive line 39 to be formed) may be formed over the exposed portions of the semiconductor layers 20. The thin dielectric layer 37 may be selectively formed on the surfaces of the semiconductor layers 20 by an oxidation process. According to another embodiment of the present invention, the thin dielectric layer 37 may be formed by a deposition process. In this case, the thin dielectric layer 37 may be formed on the surface of the line-level recesses 36 and the surface of the semiconductor layers 20. The thin dielectric layer 37 may be referred to as a gate dielectric layer.

Subsequently, horizontal conductive lines DWL may be formed by filling the line-level recesses 36 with a conductive material. The horizontal conductive lines DWL may include for example polysilicon, titanium nitride, tungsten, or a combination thereof. In a particular example, forming the horizontal conductive lines DWL may include conformally depositing titanium nitride, depositing tungsten to fill line-level recesses 36 over the titanium nitride, and etching back the titanium nitride and the tungsten. The horizontal conductive lines DWL may partially fill the line-level recesses 36, and as a result, a portion of the thin dielectric layer 37 may be exposed. Each of the horizontal conductive lines DWL may include a double-line structure, that is, two horizontal conductive lines vertically facing each other with the semiconductor layers 20 interposed therebetween. Each horizontal conductive line DWL may include a pair of a first horizontal conductive line 38 and a second horizontal conductive line 39. First-side ends of the semiconductor layers 20 may be exposed while the horizontal conductive line DWL is formed or after the horizontal conductive line DWL is formed. The vertical conductive lines DWL may correspond to the vertical conductive lines DWL as illustrated in FIGS. 1 and 2.

Subsequently, a vertical conductive line filling the first vertical opening 35 may be formed. For example, the vertical conductive line BL and the data storage elements CAP as illustrated in FIGS. 1 and 2 may be formed (as detailed below).

Figure 14:
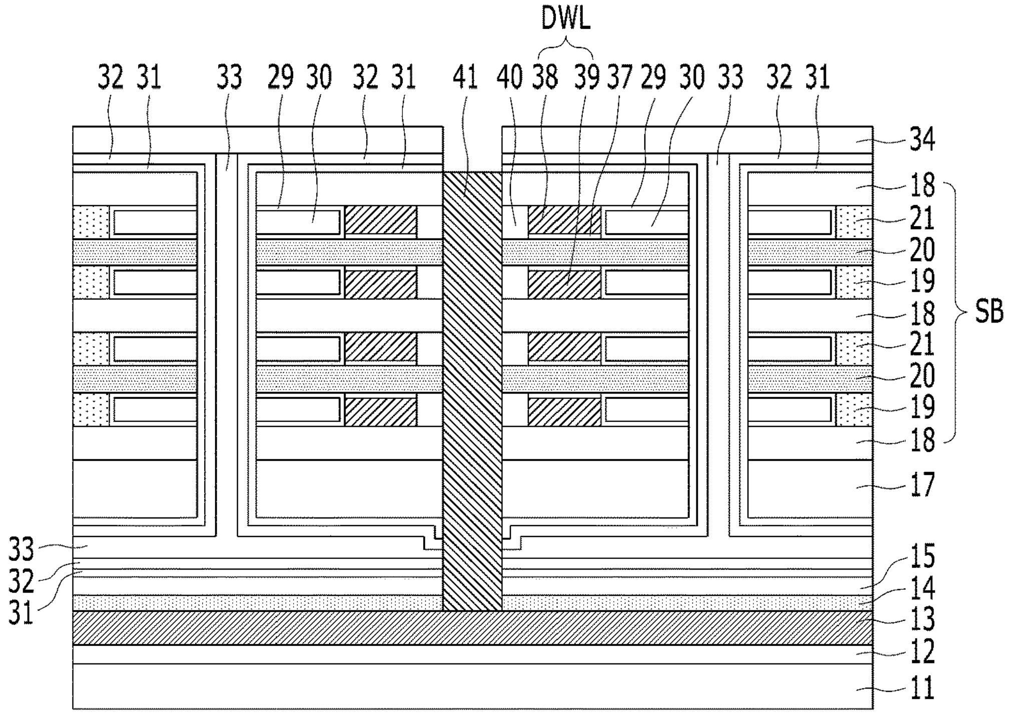

Referring to FIG. 14, first capping layers 40 contacting first sides of the horizontal conductive lines DWL may be formed. The first capping layers 40 may be disposed in the line-level recesses 36. The first capping layers 40 may include silicon oxide or silicon nitride.

Subsequently, the etch stop liner layer 31, the sacrificial liner layer 32, the sacrificial gap-fill layer 33, the first inter-layer dielectric layer 15, and the etch stopper layer 14 below the first vertical opening 35 (shown in FIG. 13) may be sequentially etched.

Accordingly, as shown in FIG. 14, the first vertical opening 35 may extend vertically to expose the conductive pad 13.

Subsequently, a vertical conductive line 41 or a bit line may be formed to fill the first vertical opening 35. The vertical conductive line 41 may correspond to the vertical conductive line BL of FIGS. 1 and 2. The vertical conductive line 41 may have a pillar shape filling the first vertical opening 35. The vertical conductive line 41 may include titanium nitride, tungsten, or a combination thereof.

The vertical conductive line 41 may be coupled to the conductive pad 13.

Figure 15:
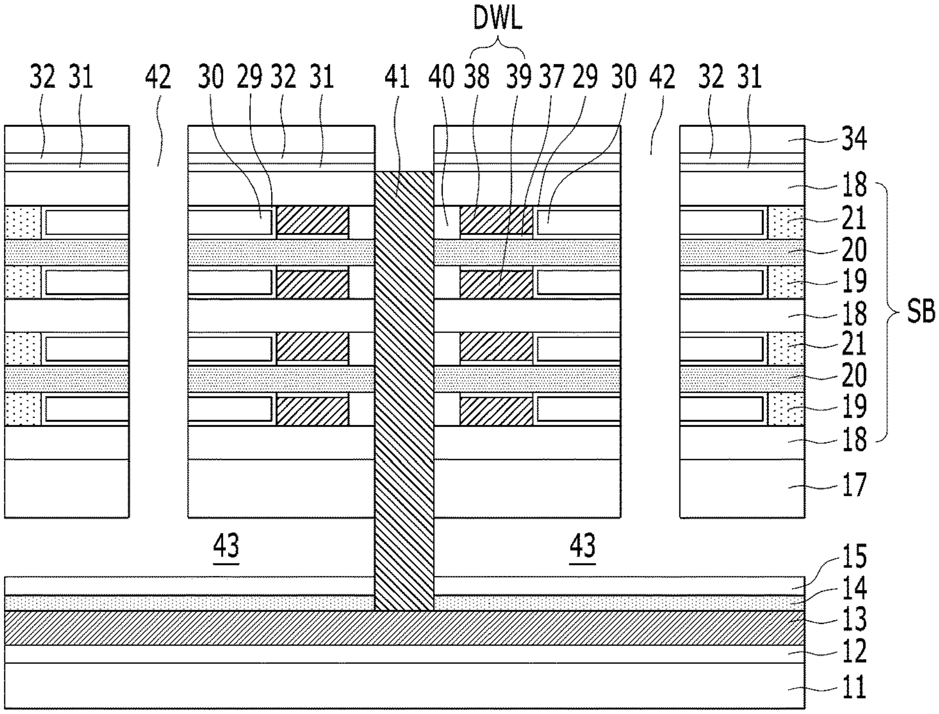

Referring to FIG. 15, second vertical openings 42 may be formed. To form the second vertical openings 42, the etch stop liner layer 31, the sacrificial liner layer 32, and the sacrificial gap-fill layer 33 may be removed. Since the etch stop liner layer 31, the sacrificial liner layer 32, and the sacrificial gap-fill layer 33 are removed, the third sacrificial openings 26 of FIG. 7 may be exposed again. The exposed third sacrificial openings 26 may become second vertical openings 42.

Second-side ends of the semiconductor layers 20 may be exposed by the second vertical openings 42. A stack of the first liner layer 29 and the second liner layer 30 may remain between the cell isolation layers 18 and the semiconductor layers 20.

As the etch stop liner layer 31, the sacrificial liner layer 32, and the sacrificial gap-fill layer 33 are removed, a pad-type recess 43 may be formed between the first inter-layer dielectric layer 15 and the second inter-layer dielectric layer 17. The pad-type recess 43 may extend from the second vertical openings 42. The pad-type recess 42 may expose the bottom portion of the vertical conductive line 41.

Figure 16:
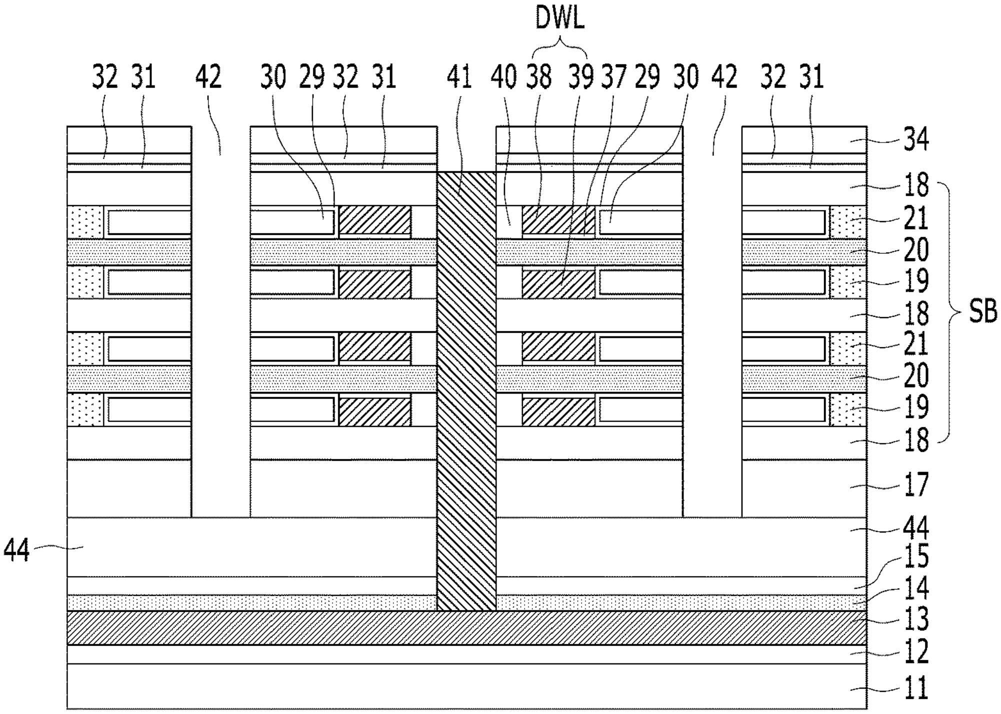

Referring to FIG. 16, a dielectric pad 44 filling the pad-shaped recess 43 may be formed. The dielectric pad 44 may include silicon oxide. The dielectric pad 44 may not fill the second vertical openings 42.

Figure 17:
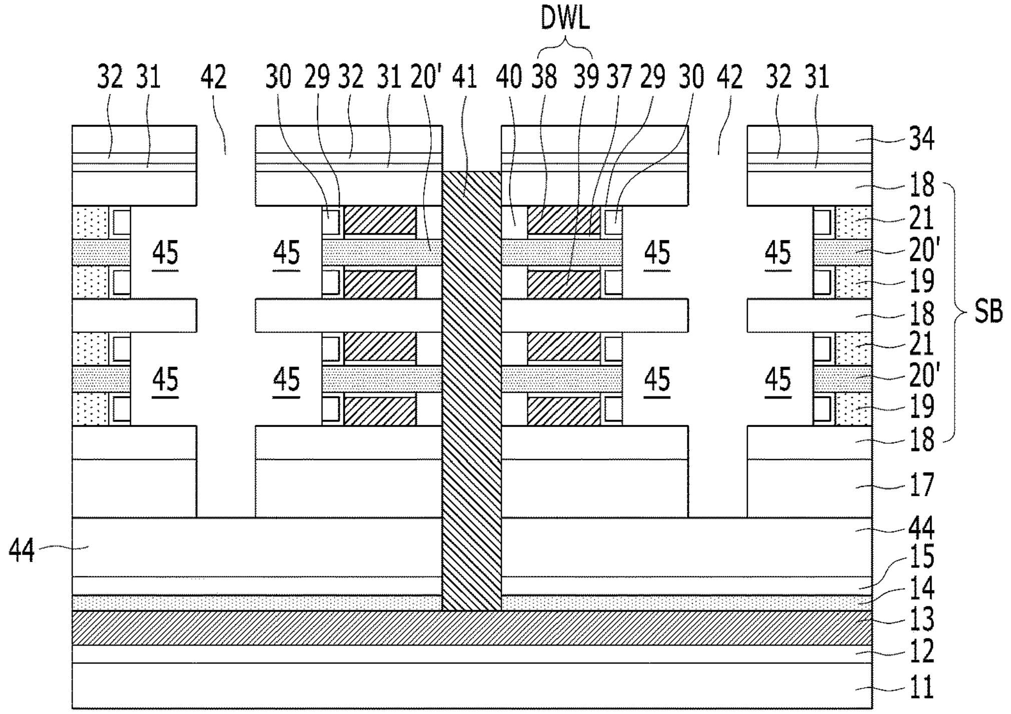

Referring to FIG. 17, the first liner layer 29 and the second liner layer 30 may be horizontally recessed through the second vertical openings 42. Subsequently, the semiconductor layers 20 may be cut, and thus a cut semiconductor layer 20' may be formed. Hereinafter, the cut semiconductor layers 20' will be simply referred to as horizontal layers 20'. The horizontal layers 20' may correspond to the horizontal layers ACT that are described in the above embodiments of the present invention.

As shown above, as a result of the recess process of the first liner layer 29 and the second liner layer 30 and the cutting process of the semiconductor layers 20, wide openings 45 and the horizontal layers 20' may be formed. The first horizontal conductive line 38 and the second horizontal conductive line 39 may be disposed with the horizontal layer 20' interposed therebetween. The first liner layer 29 and the second liner layer 30 may remain between the wide openings and the first and second horizontal conductive lines 38 and 39.

Figure 18:
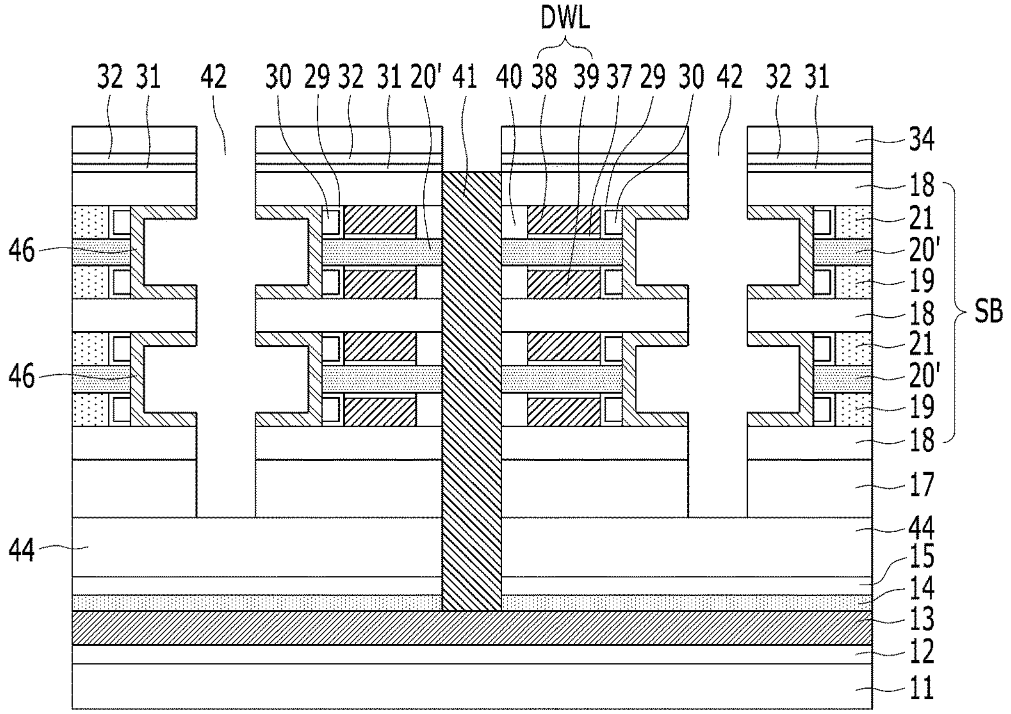

Referring to FIG. 18, the first electrodes 46 of the data storage element may be formed in the wide openings 45. The first electrodes 46 may be coupled to the horizontal layer 20'. To form the first electrodes 46, the processes of depositing a conductive material and performing an etch-back process may be performed. The first electrodes 46 may include titanium nitride. The first electrodes 46 may have a horizontally oriented cylindrical shape. The first electrodes 46 may be independently formed inside each of the wide openings 45.

Figure 19:
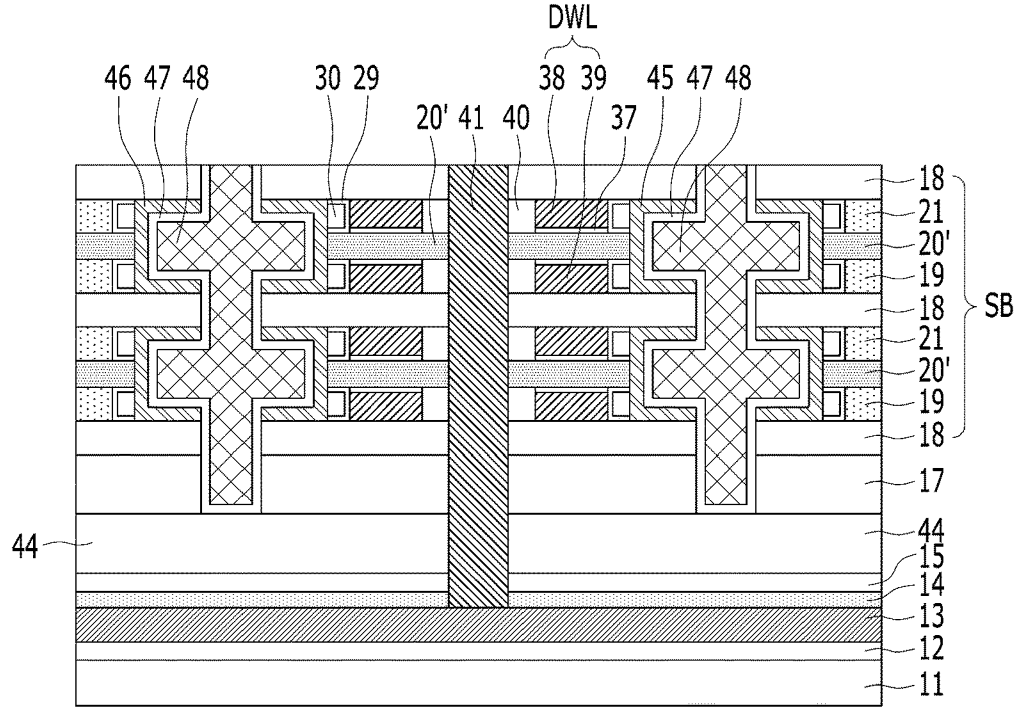

Referring to FIG. 19, dielectric layers 47 and second electrodes 48 may be sequentially formed over the first electrodes 46. Forming the second electrodes 48 may include depositing a conductive layer over the dielectric layers 47 to fill the wide openings 45 and the second vertical openings 42, and planarizing the conductive layer until the uppermost cell isolation layer 18 is exposed. During the planarization process for forming the second electrode 48, the etch stop liner layer 31, the sacrificial liner layer 32, and the hard mask pattern 34 over the uppermost cell isolation layer 18 may be removed.

Figure 20A:
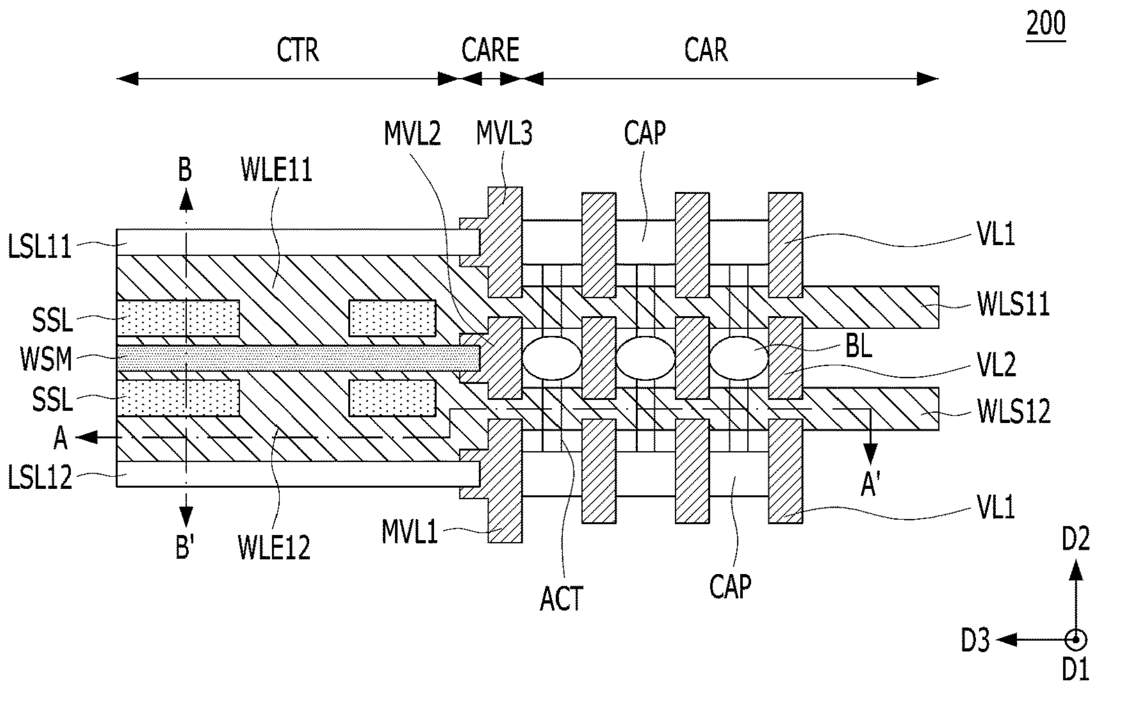
FIG. 20A is a schematic plan view illustrating a semiconductor device in accordance with still another embodiment of the present invention.
Figure 20B:
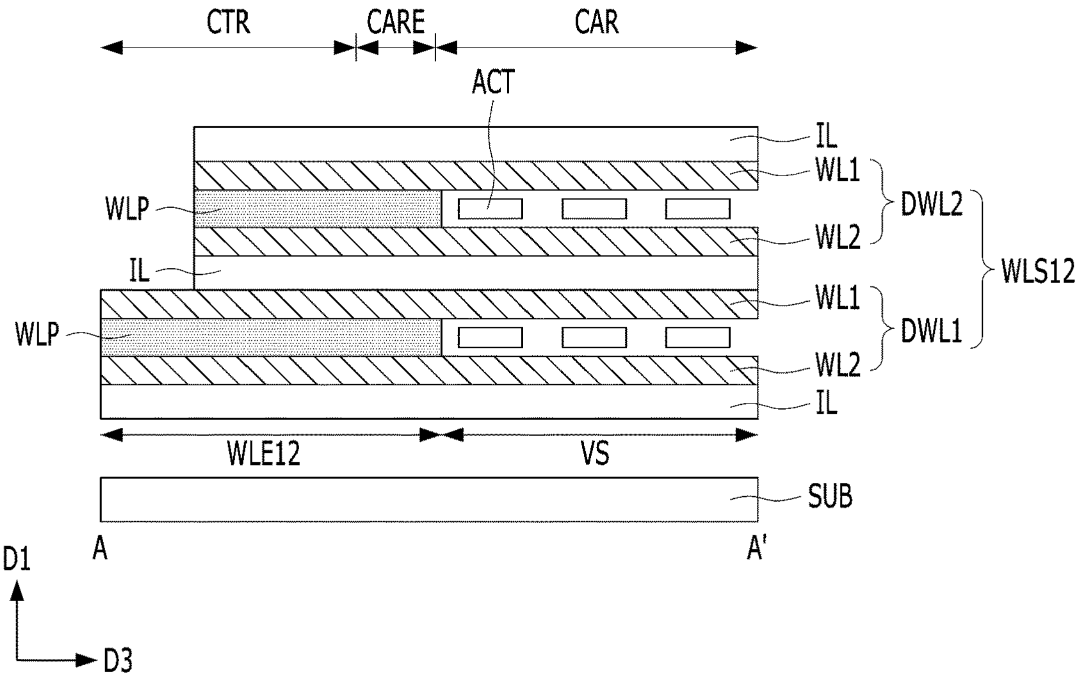
FIG. 20B is a schematic cross-sectional view taken along a line A-A' shown in FIG. 20A.
Figure 20C:
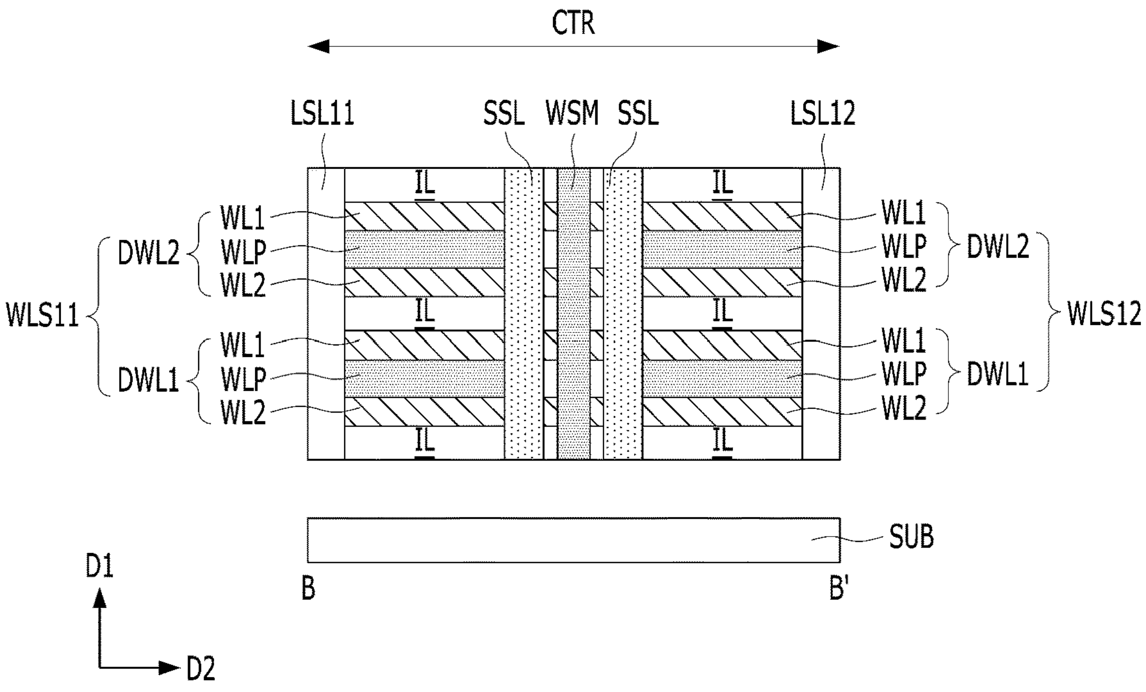
FIG. 20C is a schematic cross-sectional view taken along a line B-B' shown in FIG. 20A.

FIG. 20A is a schematic plan view illustrating a semiconductor device in accordance with another embodiment of the present invention. FIG. 20B is a schematic cross-sectional view taken along a line A-A' shown in FIG. 20A. FIG. 20C is a schematic cross-sectional view taken along a line B-B' shown in FIG. 20A. The semiconductor device 200 of FIG. 20A may be similar to the semiconductor device 100 of FIG. 1.

Referring to FIGS. 20A to 20C, the semiconductor device 200 may include a cell array region CAR, a contact region CTR, and a cell array edge region CARE. In the cell array region CAR, the memory cell array and memory cells as illustrated in FIG. 1 may be disposed. For example, vertical conductive lines BL, data storage elements CAP, horizontal layers ACT, and a plurality of horizontal conductive line stacks WLS11 and WLS12 may be disposed in the cell array region CAR. A contact portion of the memory cell array may be disposed in the contact region CTR.

Each of the horizontal conductive line stacks WLS11 to WLS12 may include a plurality of horizontal conductive lines DWL1 and DWL2. Each of the horizontal conductive line stacks WLS11 to WLS12 may include a vertical stack portion VS disposed in the cell array region CAR and a pad stack portion WLE12 and WLE12 extending from the vertical stack portion VS and disposed in the contact region CTR, as shown in FIG. 20B.

For example, the horizontal conductive line stacks WLS11 to WLS12 may include pad stack portions WLE11 to WLE12, respectively. Each of the pad stack portions WLE11 to WLE12 may have a step shape (as shown in FIG. 20B for pad stack portion WLE12), and the step shape may be defined in the contact region CTR.

Each of the horizontal conductive line stacks WLS11 to WLS12 may include horizontal conductive lines DWL1 and DWL2, and each of the horizontal conductive lines DWL1 and DWL2 may have a double structure. Each of the horizontal conductive lines DWL1 and DWL2 may include a first horizontal conductive line WL1 and a second horizontal conductive line WL2. A plurality of horizontal layers ACT may be disposed between the first horizontal conductive lines WL1 and the second horizontal conductive lines WL2 of the horizontal conductive line stacks WLS11 to WLS12 in the cell array region CAR.

Each of the pad stack portions WLE11 and WLE12 of the horizontal conductive line stacks WLS11 to WLS12 may include a first horizontal conductive line WL1, a second horizontal conductive line WL2, and a contact pad WLP between the first horizontal conductive line WL1 and the second horizontal conductive line WL2. The first horizontal conductive line WL1 and the second horizontal conductive line WL2 may be electrically connected to each other by the contact pad WLP.

In the cell array edge region CARE (as shown in FIG. 20B), the first horizontal conductive line WL1, the second horizontal conductive line WL2, and the contact pad WLP between the first horizontal conductive line WL1 and the second horizontal conductive line WL2 may be disposed. The horizontal layers ACT may not be disposed in the cell array edge region CARE.

The semiconductor device 200 may further include a separation slit WSM and large slits LSL11 and LSL12 (as shown in FIG. 20C). The separation slit WSM and the large slits LSL11 and LSL12 may extend in the third direction D3. Pad stack portions WLE11 to WLE12 may be disposed between the large slits LSL11 and LSL12 in the second direction D2. For example, a separation slit WSM may be disposed between the first pad stack portion WLE11 and the second pad stack portion WLE12. The first pad stack portion WLE11 may be disposed between the first large slit LSL11 and the separation slit WSM, and the second pad stack portion WLE12 may be disposed between the second large slit LSL12 and the separation slit WSM.

The semiconductor device 200 may further include small slits SSL. The small slits SSL may extend vertically in the first direction D1. The small slits SSL may contact the separation slit WSM.

The large slits LSL11 to LSL12 and the small slits SSL may be referred to as supporters. The large slits LSL11 to LSL12 and the small slits SSL may be formed of a dielectric material.

The semiconductor device 200 may further include a plurality of isolation structures. The isolation structure may include first vertical isolation layers MVL1, MVL2 and MVL3 and second vertical isolation layers VL1 and VL2. A plurality of first vertical isolation layers MVL1, MVL2, and MVL3 may be formed in the cell array edge region CARE. Each of the first vertical isolation layers MVL1, MVL2, and MVL3 may include protrusions. A plurality of second vertical isolation layers VL1 and VL2 may be formed in the cell array region CAR. The protrusions of the first vertical isolation layers MVL1, MVL2, and MVL3 may protrude toward the contact region CTR. The second vertical isolation layers VL1 and VL2 may be referred to as main vertical isolation layers, and the first vertical isolation layers MVL1, MVL2 and MVL3 may be referred to as additional vertical isolation layers (that is being an additional vertical isolation layer formed between the separation slit WSM and vertical isolation layers VL1 and VL2).

The first vertical isolation layers MVL1, MVL2 and MVL3 and the second vertical isolation layers VL1 and VL2 may support the horizontal conductive line stacks WLS11 to WLS12. The second vertical isolation layers VL1 and VL2 and the first vertical isolation layers MVL1, MVL2 and MVL3 may include a dielectric material. The first vertical isolation layers MVL1, MVL2 and MVL3 may contact the pad stack portions WLE11 and WLE12.

From the perspective of a top view, the first vertical isolation layers MVL1, MVL2, and MVL3 and the large slits LSL11 to LSL12 may overlap in the cell array edge region CARE. For example, ends of the large slits LSL11 to LSL12 may vertically overlap with the protrusions of the first vertical isolation layers MVL1, MVL2, and MVL3. The cross section of the first vertical isolation layers MVL1, MVL2 and MVL3 may have an ‘a’ shape or a ‘ㅏ’ shape. The ㅏ' shape for MVL1, MVL2 and MVL3 is shown in FIG. 20A.

Figure 21:
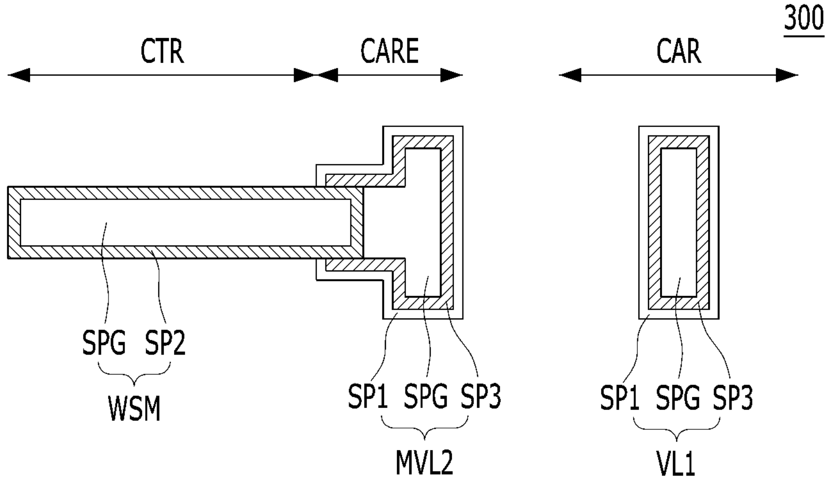
FIG. 21 is a schematic plan view illustrating a semiconductor device in accordance with yet another embodiment of the present invention.

FIG. 21 is a schematic plan view illustrating a semiconductor device 300 in accordance with another embodiment of the present invention. FIG. 21 is a plan view illustrating an example of the separation slit WSM and the isolation structure shown in FIG. 20A.

Referring to FIG. 21, the semiconductor device 300 may include a cell array region CAR, a contact region CTR, and a cell array edge region CARE. A first vertical isolation layer MVL2 may be disposed in the cell array edge region CARE, and a second vertical isolation layer VL1 may be disposed in the cell array region CAR. A separation slit WSM may be disposed in the contact region CTR.

The separation slit WSM may include a single spacer structure of a first silicon nitride spacer SP2. The first vertical isolation layers MVL2 of the cell array edge region CARE and the second vertical isolation layers VL1 of the cell array region CAR may have a double spacer structure of a silicon oxide spacer SP1 and a second silicon nitride spacer SP3, individually. Each of the separation slit WSM and the first and second vertical isolation layers MVL2 and VL1 may further include a silicon oxide gap-fill layer SPG. In the cell array edge region CARE, the separation slit WSM and the first vertical isolation layer MVL2 may partially overlap.

The first vertical isolation layers MVL1, MVL2 and MVL3 and the second vertical isolation layers VL1 and VL2 as illustrated in FIG. 20A may include a double spacer structure of the silicon oxide spacer SP2 and the second silicon nitride spacer SP3, individually.

Referring to FIGS. 20A to 21, by forming a spacer structure of different materials in the cell array region CAR and the contact region CTR, it is possible to prevent a cell-to-cell bridging, and it is possible to prevent loss of the pad stack portions WLE11 and WLE12 that are disposed adjacent to the separation slit WSM.

FIGS. 22 to 27 illustrate an example of a method for fabricating a semiconductor device in accordance with another embodiment of the present invention. FIGS. 22 to 27 show another embodiment of forming the sacrificial vertical structure 23 shown in FIG. 5. The processes of FIGS. 22 to 27 may be performed simultaneously in the cell array region CAR and the contact region CTR shown in FIG. 21. The cell array region CAR may be a first region, and the contact region CTR may be a second region.

Figure 22:
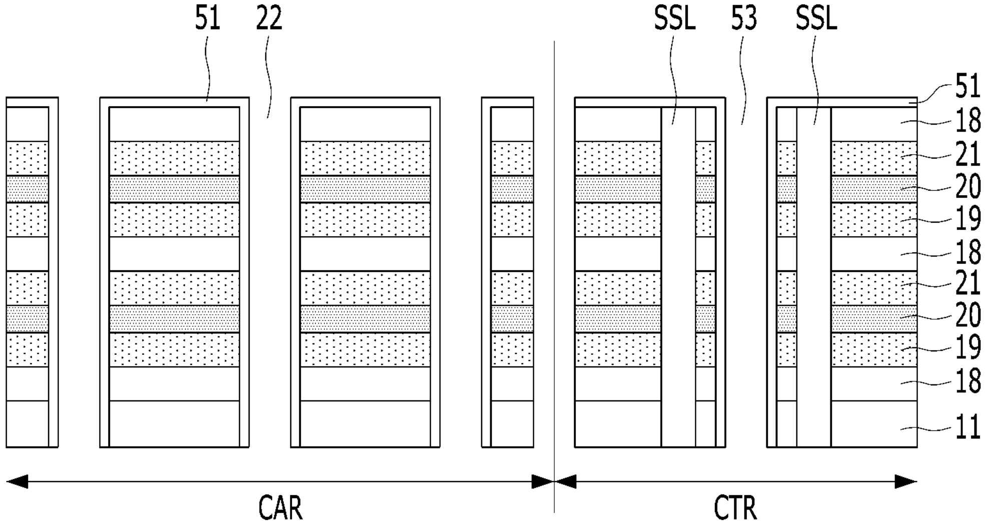
FIGS. 22 to 27 illustrate an example of a method for fabricating a semiconductor device in accordance with another embodiment of the present invention.

Referring to FIGS. 3, 4, and 22, small slits SSL may be formed in the contact region CTR. The small slits SSL may include a dielectric material. Referring to FIG. 20A, large slits LSL11 and LSL12 may be further formed around the small slits SSL.

Figure 24:
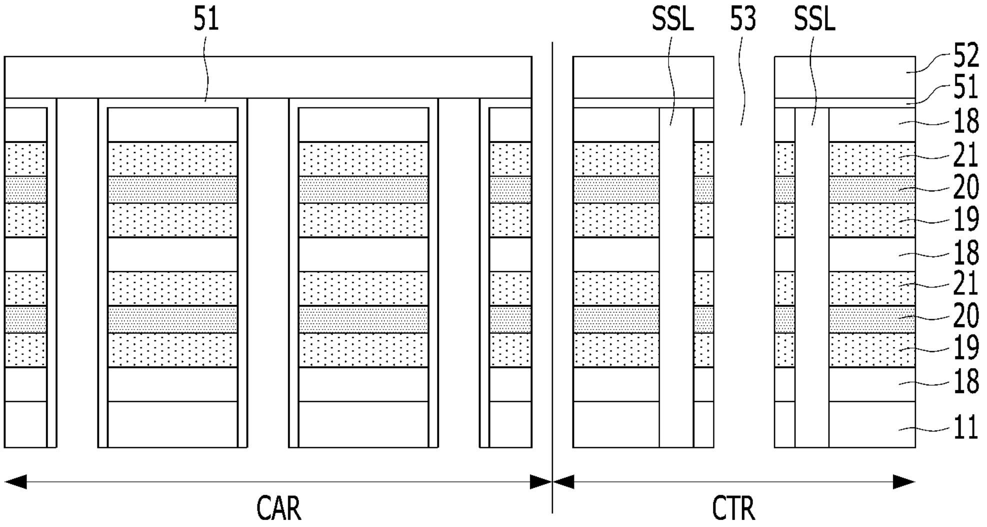

Subsequently, a sacrificial opening 22 may be formed in a stack body SB of the cell array region CAR. Referring back to FIGS. 3 and 22, the stack body SB may include cell isolation layers 18, first sacrificial layers 19, semiconductor layers 20, and second sacrificial layers 21 (as shown in FIG. 24).

Subsequently, the stack body SB of the contact region CTR may be etched to form a line isolation trench 53 between the small slits SSL.

A silicon oxide layer 51 may be formed over the sacrificial opening 22 and the line isolation trench WSL.

The silicon oxide layer 51 may be simultaneously formed in the cell array region CAR and the contact region CTR.

Figure 23:
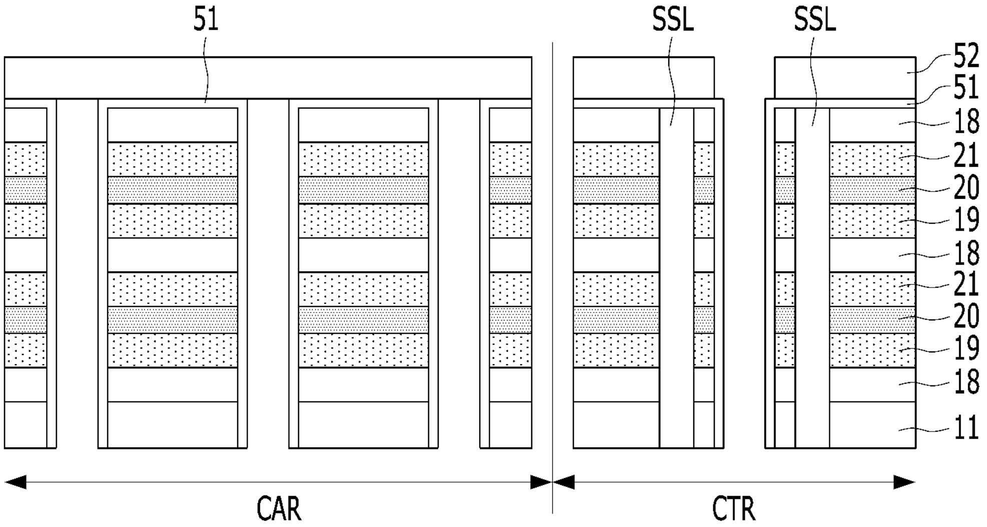

Referring to FIG. 23, an amorphous carbon mask pattern 52 may be formed over the silicon oxide layer 51. The amorphous carbon mask pattern 52 may expose a portion of the silicon oxide layer 51 in the contact region CTR. The amorphous carbon mask pattern 52 may cover the entire upper portion of the cell array region CAR.

Referring to FIG. 24, the exposed portion of the silicon oxide layer 51 may be removed from the contact region CTR. As a result, the line isolation trench 53 may be exposed again between the small slits SSL.

Figure 25:
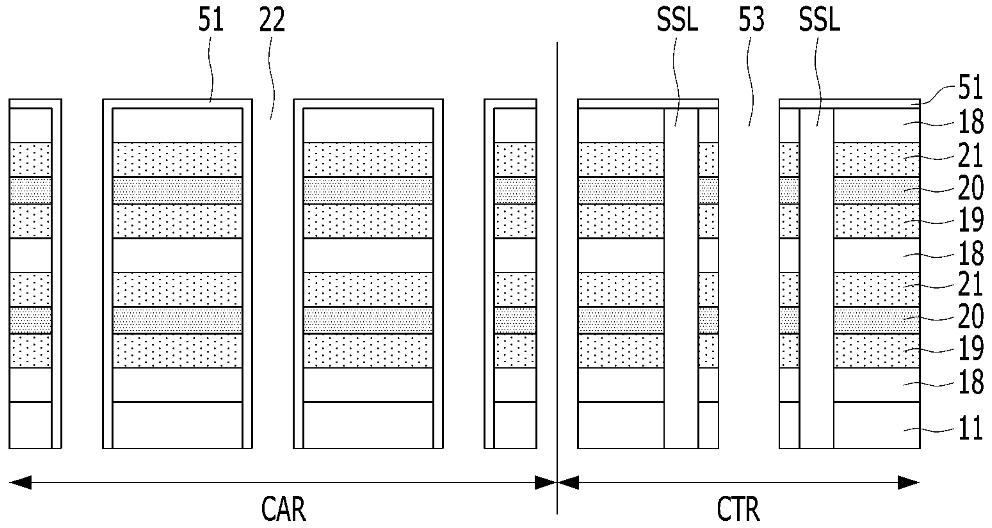

Referring to FIG. 25, the amorphous carbon mask pattern 52 may be removed. As a result, the line isolation trench 53 may be exposed in the contact region CTR, and the sacrificial opening 22 may be exposed again in the cell array region CAR.

Figure 26:
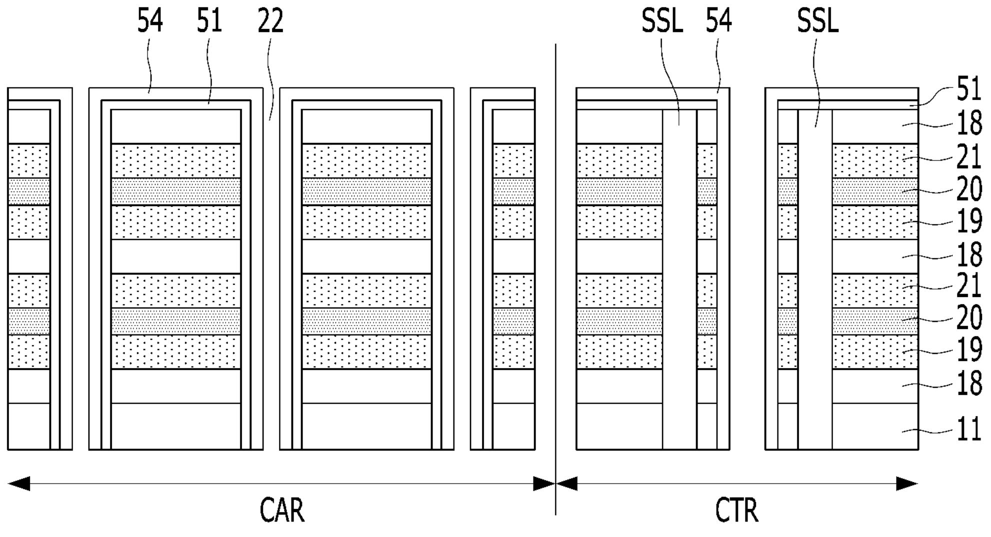

Referring to FIG. 26, a silicon nitride layer 54 may be formed over the silicon oxide layer 51. The silicon nitride layer 54 may be simultaneously formed in the cell array region CAR and the contact region CTR. The silicon nitride layer 54 may cover the surface of the line isolation trench 53. A single spacer structure of a silicon nitride layer 54 may be formed inside the line isolation trench 53, and a double spacer structure of the silicon oxide layer 51 and the silicon nitride layer 54 may be formed inside the sacrificial opening 22.

Figure 27:
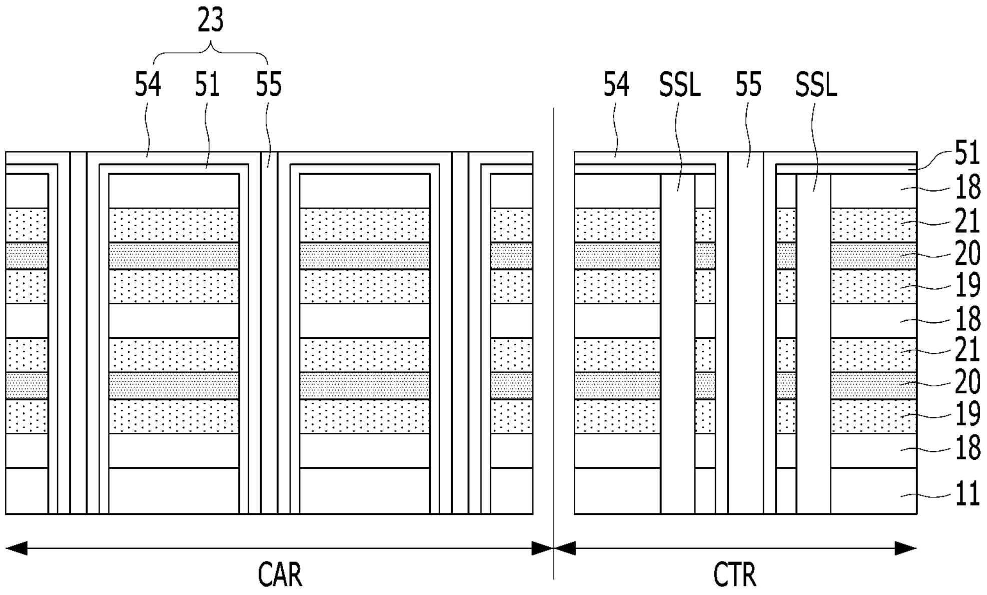

Referring to FIG. 27, a silicon oxide gap-fill layer 55 filling the sacrificial opening 22 may be formed over the silicon nitride layer 54. The silicon oxide gap-fill layer 55 may fill the line isolation trench 53 over the silicon nitride layer 54. Subsequently, the silicon oxide gap-fill layer 55 may be planarized to expose the surface of the silicon nitride layer 54.

A sacrificial vertical structure 23 may be formed in the cell array region CAR. The sacrificial vertical structure 23 may include the silicon oxide layer 51, the silicon nitride layer 54, and the silicon oxide gap-fill layer 55. A separation slit including the silicon nitride layer 54 and the silicon oxide gap-fill layer 55 may be formed in the contact region CTR. The silicon nitride layer 54 and the silicon oxide gap-fill layer 55 formed in the contact region CTR may form the separation slit WSM shown in FIGS. 20A and 21.

As described above, a double spacer structure of the silicon oxide layer 51 and the silicon nitride layer 54 may be formed in the cell array region CAR, and a single spacer structure of the silicon nitride layer 54 may be formed in the contact region CTR.

Subsequently, as illustrated in FIGS. 11 to 13, after the sacrificial vertical structure 23 is removed, the first sacrificial layers 19 and the second sacrificial layers 21 may be replaced by the horizontal conductive lines 38 and 39. For example, the first sacrificial layers 19 and the second sacrificial layers 21 may be replaced by the horizontal conductive lines 38 and 39 in the cell array region CAR and the contact region CTR. In the contact region CTR, the semiconductor layers 20 may be removed, and contact pads may fill the space from which the semiconductor layers 20 are removed. The contact pads may couple the horizontal conductive lines 38 and 39 to each other.

FIGS. 28A to 34B illustrate an example of a method for fabricating a semiconductor device in accordance with another embodiment of the present invention. FIGS. 28A to 34A are plan views, and FIGS. 28B to 34B are cross-sectional views taken along the line A-A' of FIGS. 28A to 34A. FIGS. 28A to 34B may be similar to the methods shown in FIGS. 22 to 27.

Figure 28A:
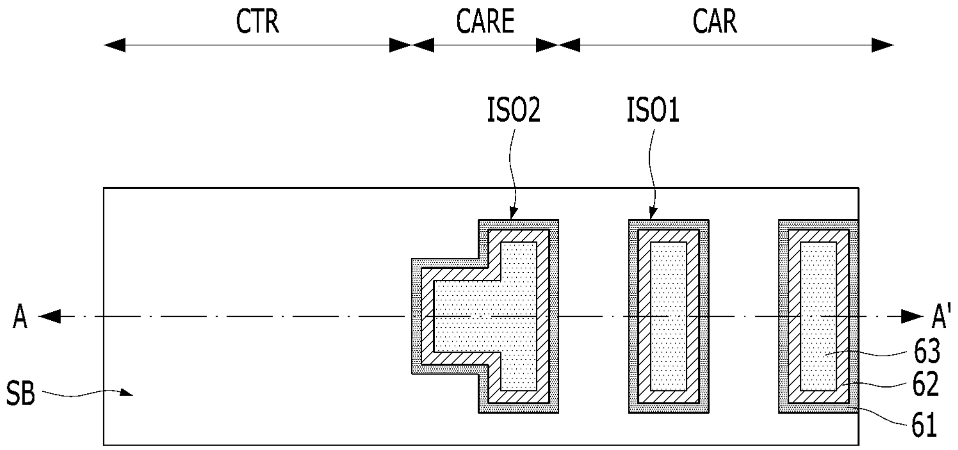
FIGS. 28A to 34B illustrate an example of a method for fabricating a semiconductor device in accordance with still another embodiment of the present invention.
Figure 28B:
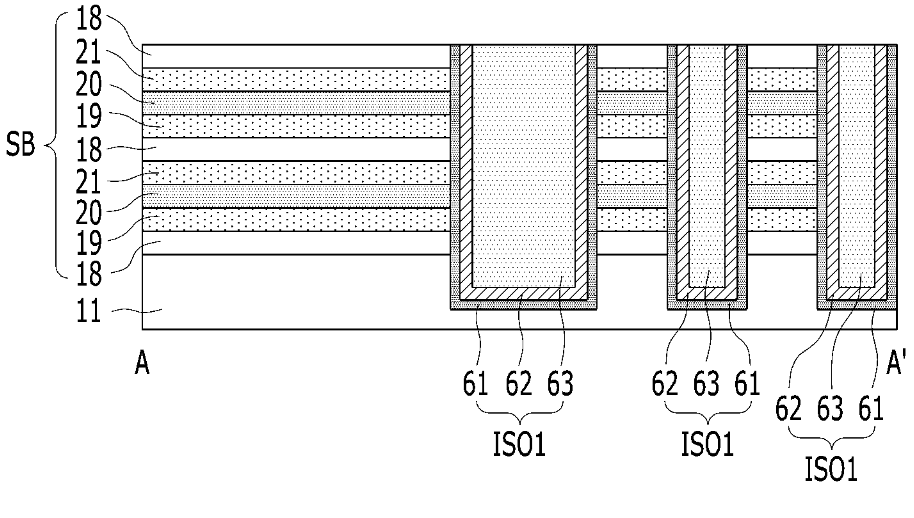

Referring to FIGS. 28A and 28B, a stack body SB may be formed over a substrate 11 in which the cell array region CAR, the contact region CTR, and the cell array edge region CARE are defined. The stack body SB may include the cell isolation layers 18, the first sacrificial layers 19, the semiconductor layers 20, and the second sacrificial layers 21. The cell isolation layers 18 may include silicon oxide, and the first sacrificial layers 19 and the second sacrificial layers 21 may include silicon nitride. The semiconductor layers 20 may include polysilicon or monocrystalline silicon. The stack body SB may include a plurality of ONSN (Oxide-Nitride-Silicon-Nitride-Oxide) stacks. The stack body SB may be formed by replacing a SiGe/Si stack, for example, a silicon germanium layer/first silicon layer/silicon germanium layer/second silicon layer/silicon germanium layer (SiGe/Si/SiGe/Si/SiGe) stack with the ONSN (Oxide-Nitride-Silicon-Nitride-Oxide) stack. The method of replacing the SiGe/Si stack with the ONSN stack may include replacing the silicon germanium layers and the first silicon layer with a stack of silicon oxide and silicon nitride, and forming a thin second silicon layer.

Subsequently, a plurality of isolation layers ISO1 and ISO2 may be formed in the stack body SB. The forming of the isolation layers ISO1 and ISO2 may include: forming a plurality of isolation openings by etching the stack body SB; sequentially forming a first silicon oxide layer 61, a silicon nitride layer 62, and a second silicon oxide layer 63 over the isolation openings; and planarizing the first silicon oxide layer 61, the silicon nitride layer 62, and the second silicon oxide layer 63. The second silicon oxide layer 63 may fill the isolation openings over the silicon nitride layer 62. The isolation layers ISO1 and ISO2 may include a first isolation layer ISO1 and a second isolation layer ISO2. The first isolation layers ISO1 may be formed in the cell array region CAR, and the second isolation layers ISO2 may be formed in the cell array edge region CARE. The first isolation layers ISO1 may correspond to the second vertical isolation layers VL1 and VL2 of FIG. 20A. The second isolation layer ISO2 may correspond to the first vertical isolation layers MVL1, MVL2, and MVL3 of FIG. 20A. From the perspective of a top view, the second isolation layer ISO2 may include a protrusion.

Each of the first and second isolation layers ISO1 and ISO2 may include the first silicon oxide layer 61, the silicon nitride layer 62, and the second silicon oxide layer 63.

The bottom surfaces of the first and second isolation layers ISO1 and ISO2 may extend into the substrate 11.

Figure 29A:
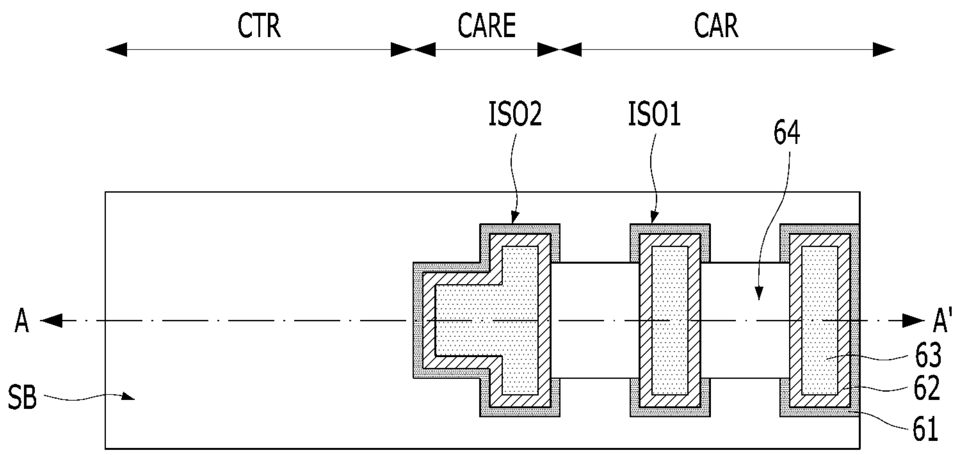
Figure 29B:
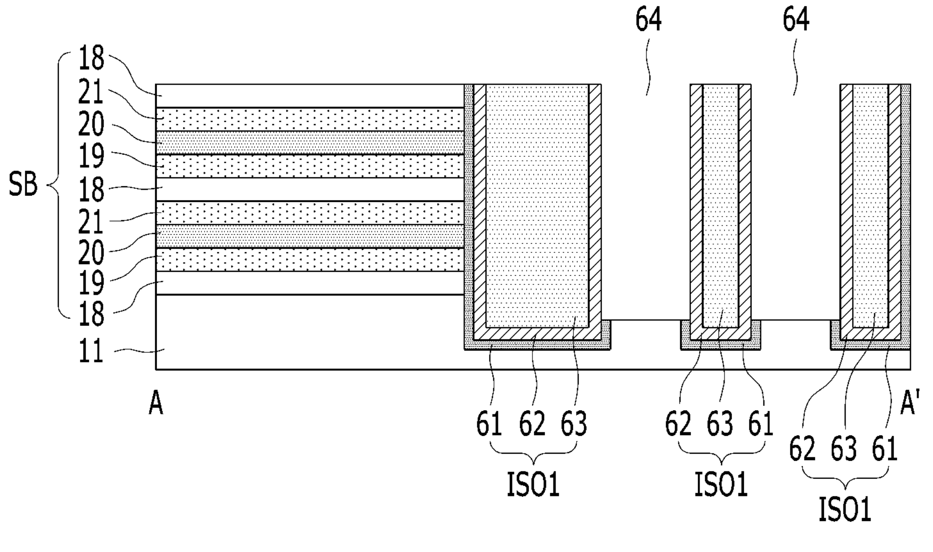

Referring to FIGS. 29A and 29B, a plurality of sacrificial openings 64 may be formed in the cell array region CAR. The sacrificial openings 64 may correspond to the first and second sacrificial openings 22 and 22' shown in FIG. 4.

In order to form a plurality of the sacrificial openings 64, the stack body SB between the first isolation layers ISO1 may be etched. While the stack body SB is etched, a portion of the first silicon oxide layer 61 of the first isolation layers ISO1 may be etched. Therefore, some sidewalls of the sacrificial openings 64 may be defined by a silicon nitride layer 62.

The bottom surface of the sacrificial openings 64 may extend into the substrate 11.

According to another embodiment of the present invention, after the sacrificial openings 64 are formed, a process of replacing the SiGe/Si stack of the stack body SB with the ONSN stack may be performed.

The first silicon oxide layer 61 of the first and second isolation layers ISO1 and ISO2 may overlap with some sidewalls of the sacrificial openings 64. In other words, some sidewalls of the sacrificial openings 64 may be defined by etching the first silicon oxide layer 61.

Figure 30A:
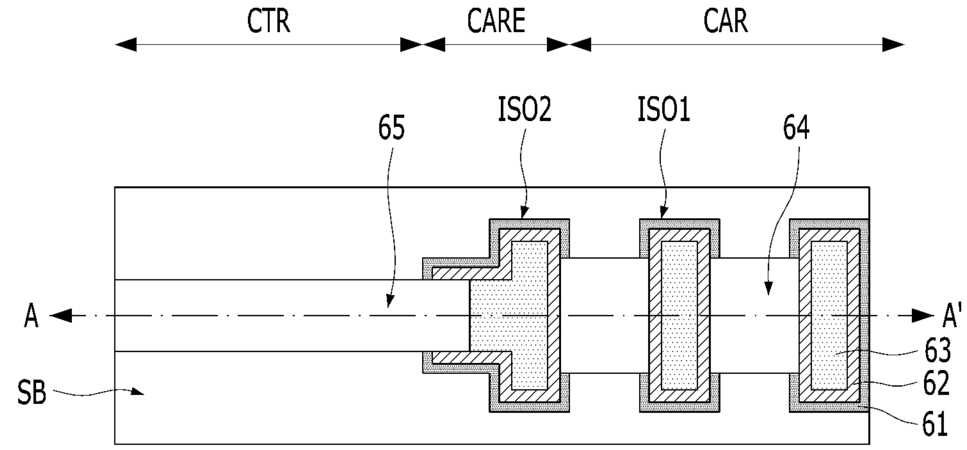
Figure 30B:
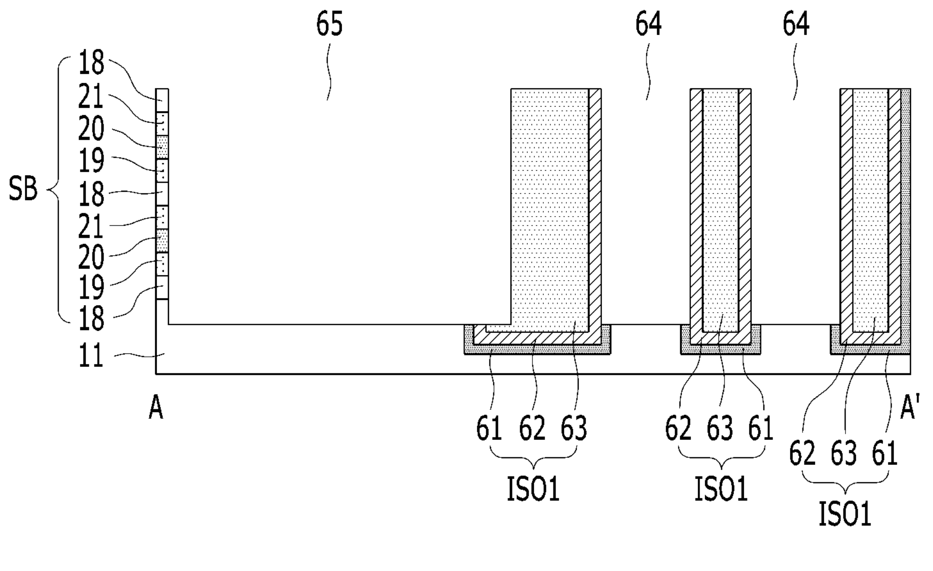

Referring to FIGS. 30A and 30B, a line isolation trench 65 may be formed in the contact region CTR. In order to form the line isolation trench 65, the stack body SB may be etched in the contact region CTR. A first-side end of the line isolation trench 65 may pass through a portion of the second isolation layer ISO2 (as shown in FIG. 30B). Accordingly, while the line isolation trench 65 is formed, a portion of the first silicon oxide layer 61 of the second isolation layer ISO2, a portion of the silicon nitride layer 62, and portions of the second silicon oxide layer 63 may be etched. The bottom surface of the line isolation trench 65 may extend into the substrate 11.

Figure 31A:
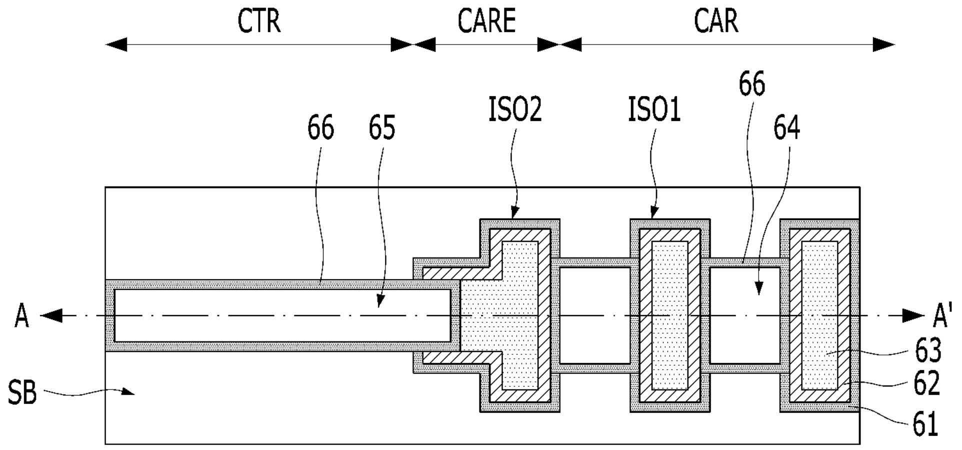
Figure 31B:
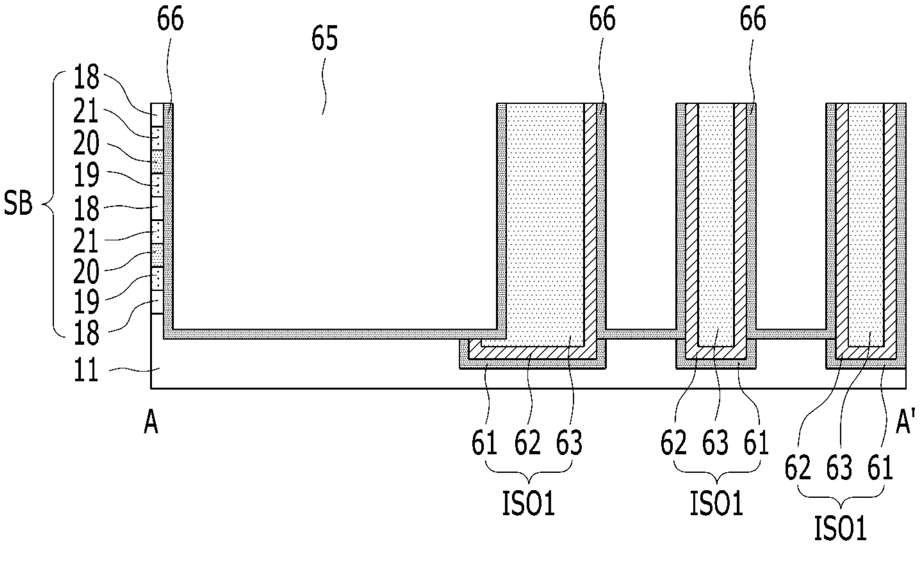

Referring to FIGS. 31A and 31B, a silicon oxide spacer layer 66 may be formed over the line isolation trench 65 and the sacrificial openings 64. The silicon oxide spacer layer 66 may be conformally formed on the sidewalls of the line isolation trench 65 and the sacrificial openings 64. The silicon oxide spacer layer 66 may correspond to the silicon oxide layer 51 shown in FIG. 22.

Figure 32A:
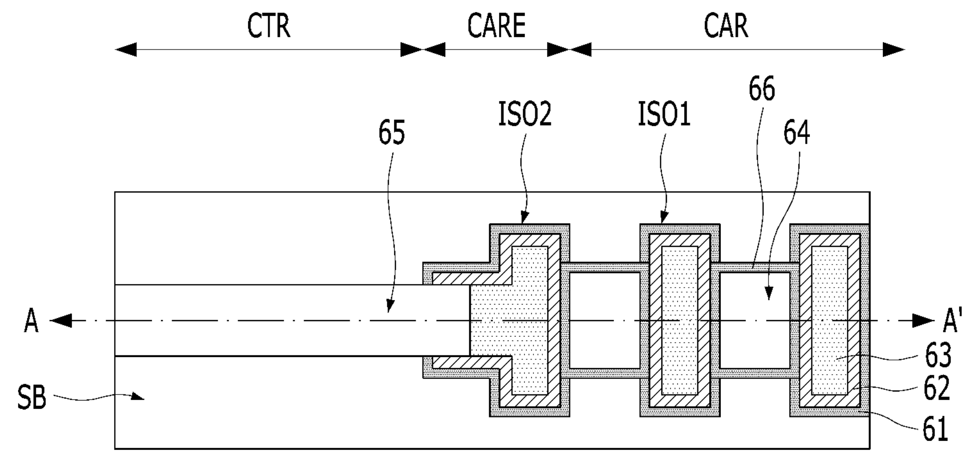
Figure 32B:
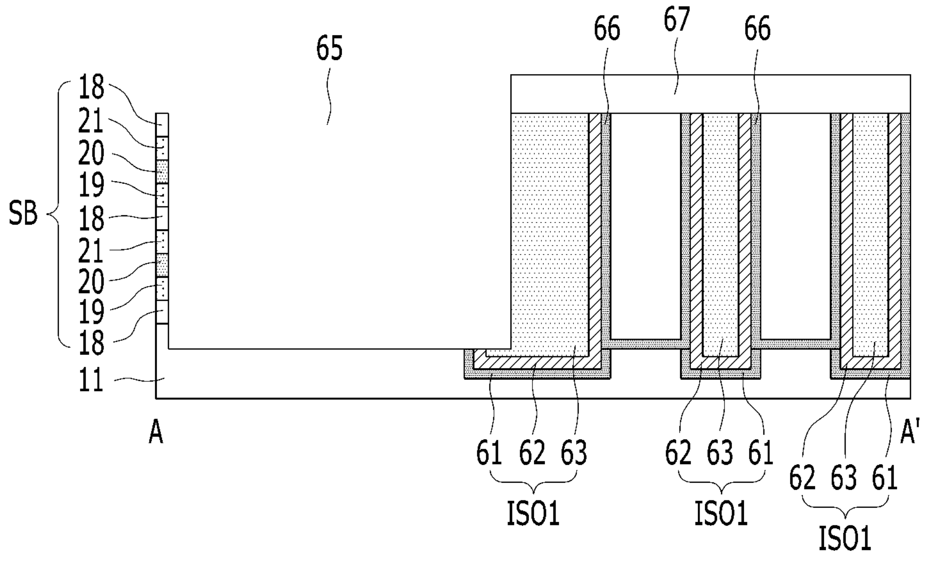

Referring to FIGS. 32A and 32B, an amorphous carbon mask pattern 67 may be formed. The amorphous carbon mask pattern 67 may correspond to the amorphous carbon mask pattern 52 shown in FIG. 23. The amorphous carbon mask pattern 67 may cover the cell array region CAR and the cell array edge region CARE, and may expose the contact region CTR.

Subsequently, a portion of the silicon oxide spacer layer 66 may be etched by using the amorphous carbon mask pattern 67 as an etch barrier. For example, the silicon oxide spacer layer 66 in the contact region CTR may be etched by using the amorphous carbon mask pattern 67. In the contact region CTR, the silicon oxide spacer layer 66 may not remain in the line isolation trench 65. The silicon oxide spacer layer 66 may remain in the cell array region CAR. The silicon oxide spacer layer 66 may contact a portion of the silicon nitride layer 62 of the first isolation layers ISO1.

Figure 33A:
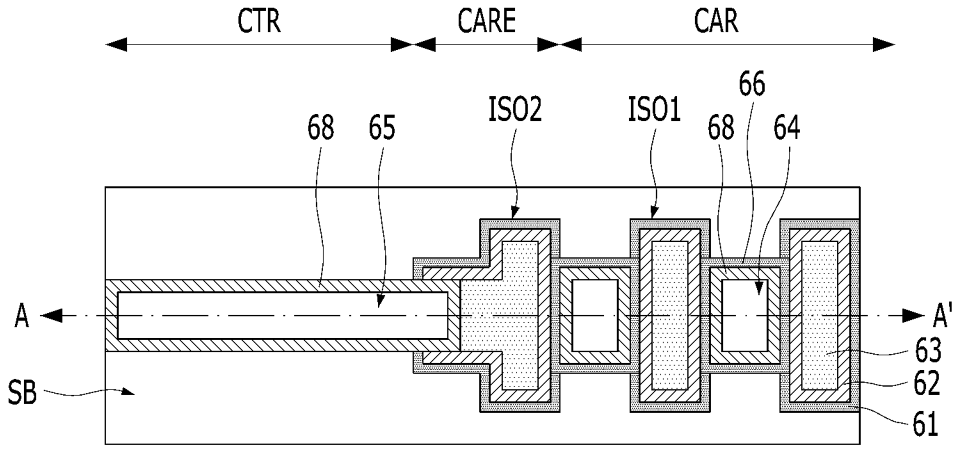
Figure 33B:
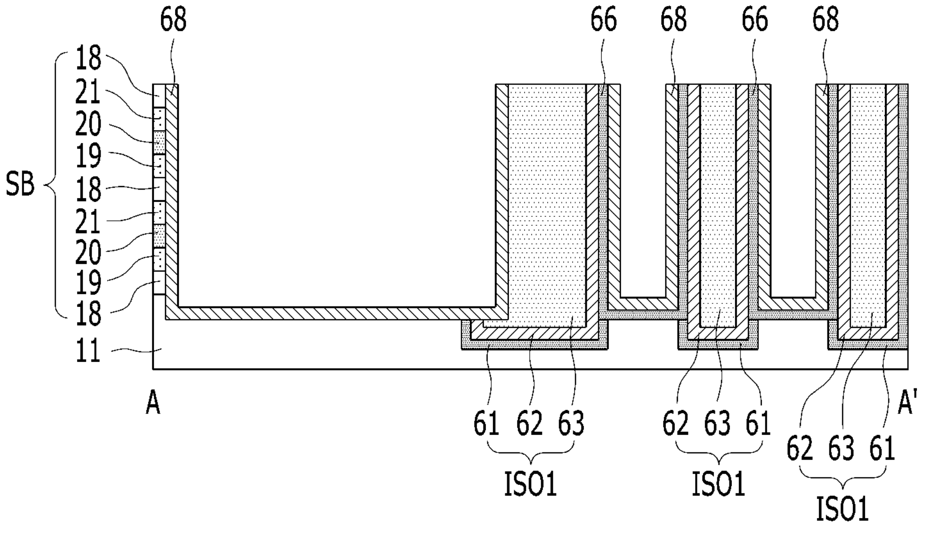

Referring to FIGS. 33A and 33B, after the amorphous carbon mask pattern 67 is removed, a silicon nitride spacer layer 68 may be formed. The silicon nitride spacer layer 68 may be formed over the sacrificial openings 64 and the line isolation trench 65. The silicon nitride spacer layer 68 may be formed over the silicon oxide spacer layer 66 in the sacrificial openings 64. The silicon nitride spacer layer 68 may be formed on the sidewalls and bottom surfaces of the line isolation trench 65.

According to the above description, a single spacer structure of the silicon nitride spacer layer 68 may be formed in the line isolation trench 65, and a double spacer structure of the silicon oxide spacer layer 66 and the silicon nitride spacer layer 68 may be formed in the sacrificial openings 64.

Since the silicon oxide spacer layer 66 is already formed in the cell array region CAR, it is possible to prevent the silicon nitride layer 62 and the silicon nitride spacer layer 68 of the first and second isolation layers ISO1 and ISO2 from contacting each other.

Figure 34A:
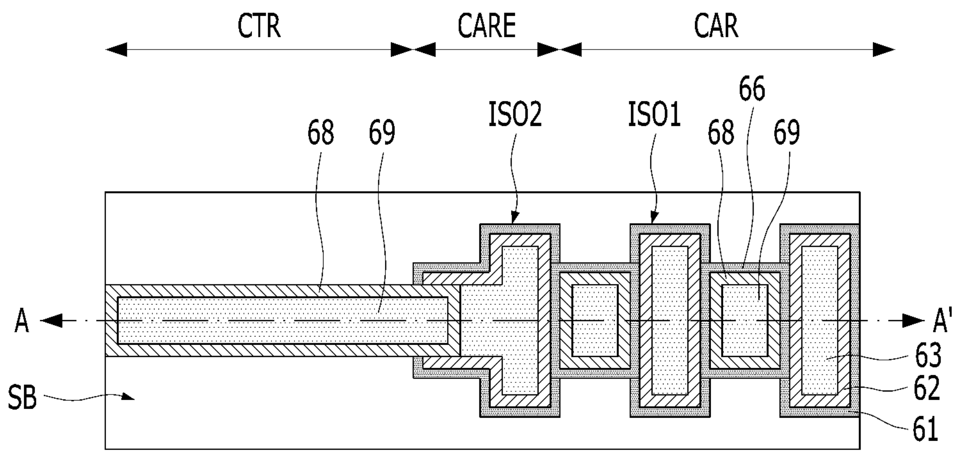
Figure 34B:
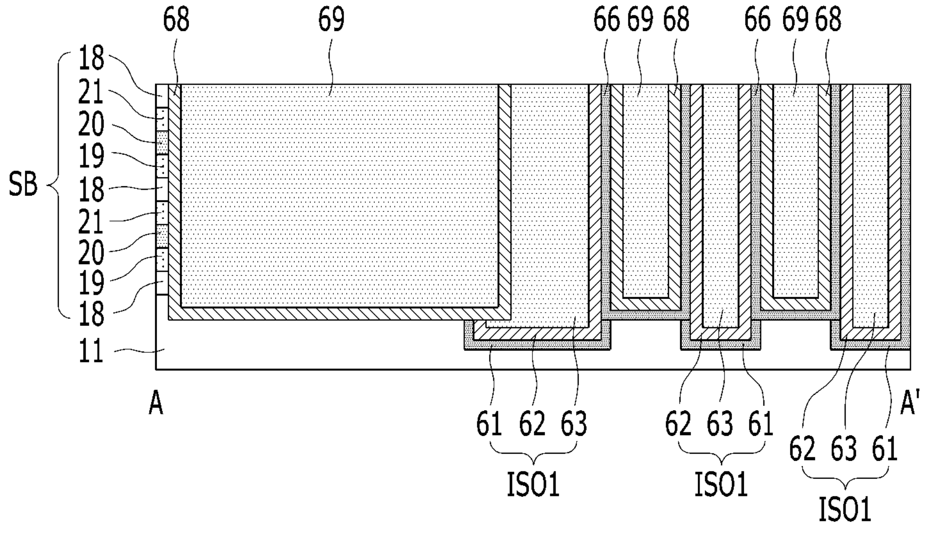

Referring to FIGS. 34A and 34B, a silicon oxide gap-fill layer 69 may be formed over the silicon nitride spacer layer 68. The silicon oxide gap-fill layer 69 may be able to fill the sacrificial openings 64 and the line isolation trench 65 over the silicon nitride spacer layer 68. The silicon oxide spacer layer 66, the silicon nitride spacer layer 68, and the silicon oxide gap-fill layer 69 that are formed in the cell array region CAR may correspond to the sacrificial vertical structure 23 shown in FIG. 5. The silicon nitride spacer layer 68 and the silicon oxide gap-fill layer 69 disposed in the line isolation trench 65 may form an 'isolation slit'.

In order to form the horizontal layers ACT as illustrated in FIG. 20A, a separation process of the semiconductor layers 20 may be performed. The separation process of the semiconductor layers 20 may be performed after the first and second isolation layers ISO1 and ISO2 shown in FIG. 34A are removed. After the separation process of the semiconductor layers 20, the first and second isolation layers ISO1 and ISO2 may be formed again. The first and second isolation layers ISO1 and ISO2 that are filled again may include a stack of the silicon oxide layer 61, the silicon nitride layer 62, and the silicon oxide layer 63. According to another embodiment of the present invention, the first and second isolation layers ISO1 and ISO2 that are filled again may include for example a silicon oxide layer, a silicon nitride layer, a silicon carbon oxide (SiCO), or a combination thereof.

The process of removing the first and second isolation layers ISO1 and ISO2 for the isolation process of the semiconductor layers may include etching the second silicon oxide layer 63 by using the silicon nitride layer 62 as a barrier, removing the silicon nitride layer 62 by using the first silicon oxide layer 61 as a barrier, and removing the first silicon oxide layer 61. While the silicon nitride layer 62 is removed, the silicon oxide spacer layer 66 may prevent loss of the silicon nitride spacer layer 68. While the first silicon oxide layer 61 is removed, the silicon oxide spacer layer 66 may be lost, but the silicon nitride spacer layer 68 is not be removed. Since the loss of the silicon oxide gap-fill layer 69 is suppressed by the silicon nitride spacer layer 68, a not-open condition may be prevented in the process of forming the first vertical opening 35 as illustrated in FIG. 11.

After the isolation process of the semiconductor layers 20, a series of the processes as illustrated in FIGS. 6 to 19 may be performed.

The process of forming the contact pads WLP as illustrated in FIG. 20B may include forming the horizontal conductive lines DWL, removing the horizontal layers ACT from the contact region CTR, filling the space from which the horizontal layers ACT are removed with the contact pads WLP. The process of removing the horizontal layers ACT from the contact region CTR may include removing the silicon nitride spacer layer 68 and the silicon oxide gap-fill layer 69 that fill the line isolation trench 65 in the contact region CTR, and removing the horizontal layers ACT through the line isolation trench 65. After the contact pads WLP are formed, the line isolation trench 65 may be filled again with the silicon nitride spacer layer 68 and the silicon oxide gap-fill layer 69.

According to one embodiment of the present invention, it is possible to prevent cell-to-cell bridging by forming spacers of different materials in a cell array region and a contact region.

According to one embodiment of the present invention, it is possible to realize a three-dimensional semiconductor device with improved electrical characteristics and reliability.

While the present invention has been described with respect to the specific embodiments, it will be apparent to those skilled in the art that various changes and modifications may be made without departing from the spirit and scope of the invention.

What is claimed is:

1. A method for fabricating a semiconductor device, comprising:

forming a stack body over a substrate;

forming a sacrificial vertical structure including a double spacer in a first region of the stack body;

forming a separation slit including a single spacer in a second region of the stack body to be spaced apart from the sacrificial vertical structure;

forming a vertical opening in the first region of the stack body by removing the sacrificial vertical structure; and forming a vertical conductive line filling the vertical opening.

2. The method of claim 1, wherein the stack body includes a dielectric layer, a semiconductor layer, or a combination thereof.

3. The method of claim 1, wherein the stack body is stacked in order of a silicon oxide, a first silicon nitride, a semiconductor layer, and a second silicon nitride.

4. The method of claim 1, wherein the double spacer includes a silicon oxide spacer and a first silicon nitride spacer.

5. The method of claim 4, wherein the single spacer includes a second silicon nitride spacer.

6. A method for fabricating a semiconductor device, comprising:

forming a stack body over a substrate;

forming a first opening in a first region of the stack body;

forming a second opening in a second region of the stack body;

forming a first spacer over the first opening and the second opening;

removing the first spacer from the second opening in the second region to leave the first spacer in the first region;

forming a second spacer over the first spacer and the second opening; and forming a gap-fill layer filling the first opening and the second opening over the second spacer wherein the first spacer is formed to cover all surfaces of the first opening.

7. The method of claim 6, wherein a double spacer structure of the first spacer and the second spacer is formed in the first region, and a single spacer structure of the second spacer is formed in the second region.

8. The method of claim 6, wherein the first spacer includes silicon oxide, and the second spacer includes silicon nitride.

9. The method of claim 6, further comprising:

forming a vertical opening in the first region of the stack body by removing the gap-fill layer, the second spacer, and the first spacer from the first region; and forming a vertical conductive line filling the vertical opening.

10. The method of claim 6, wherein the stack body includes a dielectric layer, a semiconductor layer, or a combination thereof.

11. The method of claim 6, wherein the stack body is stacked in order of a silicon oxide, a first silicon nitride, a semiconductor layer, and a second silicon nitride.

12. The method of claim 11, further comprising:

replacing each of the first silicon nitride and the second silicon nitride with horizontal conductive lines.

* * * * *